(12) United States Patent
Ouderkirk et al.

(10) Patent No.: US 11,398,594 B1
(45) Date of Patent: Jul. 26, 2022

(54) STEPPED PIEZOELECTRIC ACTUATOR

(71) Applicant: Facebook Technologies, LLC, Menlo Park, CA (US)

(72) Inventors: Andrew John Ouderkirk, Redmond, WA (US); Katherine Marie Smyth, Seattle, WA (US); Spencer Allan Wells, Seattle, WA (US); James Ransley, Medford, MA (US); Nagi Elabbasi, Southborough, MA (US)

(73) Assignee: Facebook Technologies, LLC, Menlo Park, CA (US)

( * ) Notice: Subject to any disclaimer, the term of this patent is extended or adjusted under 35 U.S.C. 154(b) by 561 days.

(21) Appl. No.: 16/386,977

(22) Filed: Apr. 17, 2019

Related U.S. Application Data

(60) Provisional application No. 62/824,286, filed on Mar. 26, 2019.

(51) Int. Cl.
| | | |
|---|---|---|
| *H01L 41/09* | (2006.01) | |
| *H01L 41/047* | (2006.01) | |
| *H01L 41/083* | (2006.01) | |
| *H01L 41/187* | (2006.01) | |
| *H01L 41/257* | (2013.01) | |
| *H01L 41/277* | (2013.01) | |
| *H01L 41/293* | (2013.01) | |
| *H01L 41/297* | (2013.01) | |
| *H01L 41/333* | (2013.01) | |

(52) U.S. Cl.
CPC ........ *H01L 41/096* (2013.01); *H01L 41/0471* (2013.01); *H01L 41/0472* (2013.01); *H01L 41/0831* (2013.01); *H01L 41/1871* (2013.01); *H01L 41/1873* (2013.01); *H01L 41/1875* (2013.01); *H01L 41/1876* (2013.01); *H01L 41/1878* (2013.01); *H01L 41/257* (2013.01); *H01L 41/277* (2013.01); *H01L 41/293* (2013.01); *H01L 41/297* (2013.01); *H01L 41/333* (2013.01)

(58) Field of Classification Search
CPC .............. H01L 41/096; H01L 41/0471; H01L 41/0472; H01L 41/0831; H01L 41/1871; H01L 41/1873; H01L 41/1875; H01L 41/1876; H01L 41/1878; H01L 41/257; H01L 41/277; H01L 41/293; H01L 41/297; H01L 41/333
USPC ......................................................... 310/332
See application file for complete search history.

(56) References Cited

U.S. PATENT DOCUMENTS

| | | | | |
|---|---|---|---|---|
| 6,118,637 | A | * | 9/2000 | Wright ................. G11B 5/5552 360/245.3 |
| 2016/0273351 | A1 | * | 9/2016 | Fripp ...................... E21B 47/18 |
| 2019/0044053 | A1 | | 2/2019 | Hamada et al. |

OTHER PUBLICATIONS

Maurya et al., "Lead-free piezoelectric materials and composites for high power density energy harvesting", Journal of Materials Research, Jun. 22, 2018, pp. 1-29.

* cited by examiner

*Primary Examiner* — Shawki S Ismail
*Assistant Examiner* — Monica Mata
(74) *Attorney, Agent, or Firm* — FisherBroyles, LLP

(57) ABSTRACT

A bender beam actuator includes a first layer of piezoelectric material and a second layer of piezoelectric material overlying a portion of the first layer of piezoelectric material, where a length of the first layer of piezoelectric material is at least 2% greater than a length of the second layer of piezoelectric material.

20 Claims, 26 Drawing Sheets

STEPPED PIEZOELECTRIC ACTUATOR

CROSS-REFERENCE TO RELATED APPLICATION

This application claims the benefit of priority under 35 U.S.C. § 119(e) of U.S. Provisional Application No. 62/824,286, filed Mar. 26, 2019, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
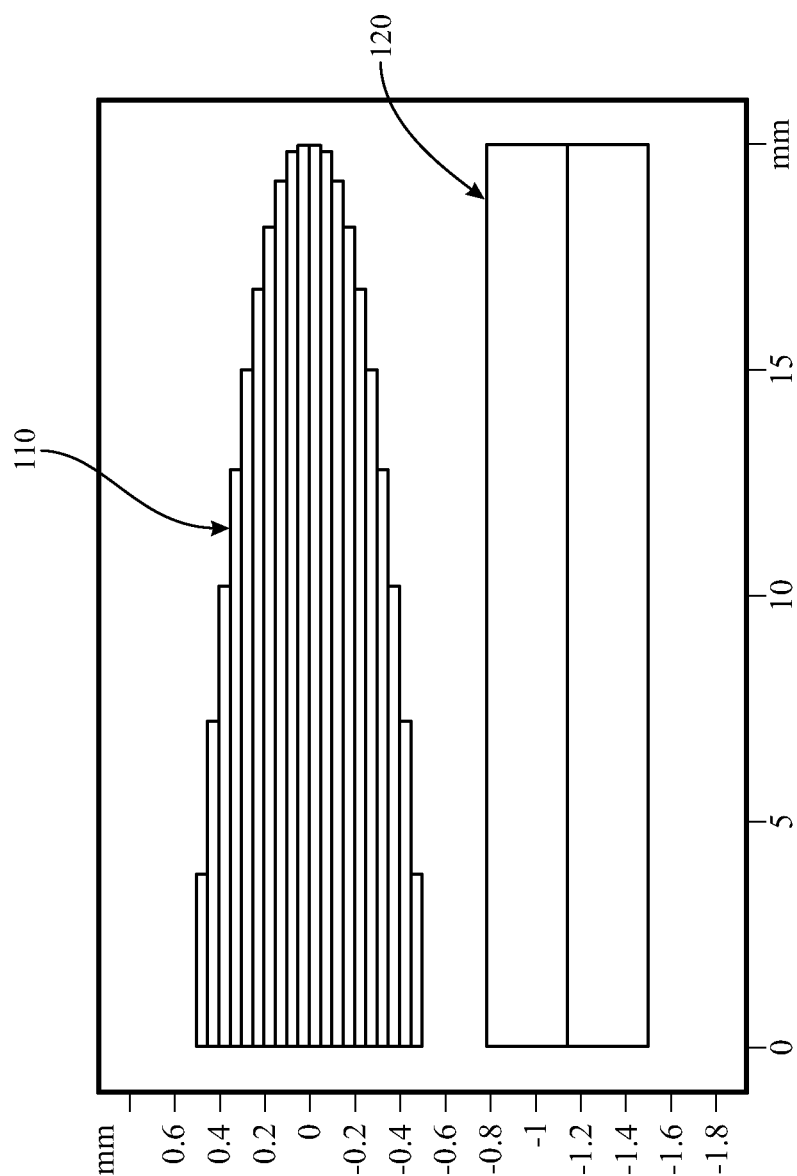
FIG. 1 is a schematic illustration showing (a) a stepped multimorph actuator according to various embodiments, and (b) a comparative bimorph actuator.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Piezoelectric actuators may be used to convert electrical energy into mechanical energy and, in some embodiments, controllably tune the properties, i.e., performance, of an optical element such as a lens. Example actuators include bender beams and other stacked architectures that may convert electrical energy into force and/or displacement along a thickness or lateral dimension. A piezoelectric "bender beam," in certain examples, may include a laminate of multiple piezoelectric material layers, where one end of the beam may be attached to a support (i.e., anchored) while the opposite end may be configured to exert a force through actuation and an optional displacement. Thus, certain embodiments relate to a stepped cantilever multimorph bender beam. As used herein, a "multimorph" may, in some examples, refer to a multi-layer bending actuator that includes at least two active (e.g., electroactive, piezoelectric, electrostrictive, etc.) layer. The terms "bender," "bender beam," "bending actuator," "transducer," and "actuator" are used interchangeably herein.

Piezoelectric bender beam actuators may be used in applications where substantial force and displacement are desired, such as in highly constrained spaces. Conventionally, bender beam actuators are designed with a constant thickness. However, such a design may create high stresses within the piezoelectric layers, which may limit performance and potentially lead to tensile or compressive failure of the actuator. Moreover, in many conventional bender beam actuators, the thickness of the distal end of the actuator may disadvantageously increase the effective amount of space needed to accommodate the displacement. In space-constrained applications, this added thickness can limit performance, and limit the effective power density of the actuator.

In view of the foregoing, the present disclosure is generally directed to stepped bender beam stacked actuators and a process for forming a bender beam stacked actuator having a higher specific power and higher energy density than conventional bimorph bender beams. As will be explained in greater detail below, embodiments of the present disclosure relate also to stepped piezoelectric actuators that may be used to control an optical element.

According to certain embodiments, in multilayer (stepped) piezoelectric actuators, the layer length may be varied through the thickness of the actuator body such that the layer length, e.g., extending from an anchored end, may decrease with increasing distance from a centerline of the actuator body. Advantageously, such stepped actuators may exhibit lower stresses, higher displacements, and higher blocking forces than equivalent mass planar actuators. For example, in response to frictional forces, higher displacements and lower reverse fields (to return the actuator to an initial, unactuated position) may be achieved relative to equivalent mass bimorph actuators. In some embodiments, a stiff or compliant material may be used to fill the steps across the surface of the actuator, which may decrease stress concentrations at or proximate to the stepped regions.

In accordance with various embodiments, a multilayer piezoelectric actuator may include one or more non-piezoelectric layers. In such designs, a first layer of piezoelectric material may be disposed between a pair of electrodes, i.e., a primary electrode and a secondary electrode, and a second layer may be disposed over the first layer of piezoelectric material.

In some embodiments, a stepped actuator may include plural layers of a piezoelectric material alternately arranged between conductive electrodes. Suitable piezoelectric materials include ceramic and polymer materials. In the presence of an applied field (E-field), a piezoelectric material may deform (e.g., compress, elongate, shear, etc.) according to the magnitude and direction of the applied field. Generation of such a field may be accomplished, for example, by placing the piezoelectric material between two or more electrodes, i.e., a primary electrode and a secondary electrode, each of which is at a different potential. As the potential difference (i.e., voltage difference) between the electrodes is increased (e.g., from zero potential), the electric field increases, and the amount of deformation also increases.

Example piezoelectric ceramics include lead zirconate titanate (PZT), bismuth ferrite, barium titanate, bismuth titanate, potassium sodium niobate (KNN), barium titanate, lead magnesium niobate-lead titanate, etc., as well as combinations thereof. The ceramic compositions may further include a dopant, such as lanthanum, neodymium and/or manganese. Further example piezoelectric materials may include composite materials, such as mixtures of an active and/or inactive polymer and a ceramic composition.

In some embodiments, each piezoelectric layer (e.g., the first piezoelectric layer and the second piezoelectric layer) may have a thickness of approximately 10 nm to approximately 100 μm (e.g., approximately 10 nm, approximately 20 nm, approximately 50 nm, approximately 100 nm, approximately 200 nm, approximately 500 nm, approximately 1000 nm, approximately 2000 nm, approximately 5000 nm, approximately 10,000 nm, approximately 20,000 nm, approximately 50,000 nm, or approximately 100,000 nm, including ranges between any of the foregoing values), with an example thickness of approximately 200 nm to approximately 500 nm. By way of example, in certain embodiments, the individual layers of piezoelectric material may have the same thickness.

In accordance with certain embodiments, single crystal piezoelectric materials may be formed using hydrothermal processing or a Czochralski crystal growth method to produce an oriented ingot, which may be cut along a specified crystal plane to produce wafers having a desired crystalline orientation. A wafer may be thinned, e.g., via lapping, or polished, and electrodes may be formed directly on the wafer, e.g., using chemical vapor deposition or a physical vapor deposition process such as sputtering or evaporation.

Polycrystalline piezoelectric materials may be formed, e.g., by powder processing. Densely-packed networks of high purity, ultrafine polycrystalline particles can be highly transparent and may be more mechanically robust in thin layers than their single crystal counterparts. For instance, optical grade PLZT having >99.9% purity may be formed using sub-micron (e.g., <2 μm) particles. Moreover, substitution via doping of $Pb^{2+}$ at A and B-site vacancies with $La^{2+}$ and/or $Ba^{2+}$ may be used to increase the transparency of perovskite ceramics such as PZN-PT, PZT and PMN-PT.

Ultrafine particle precursors can be fabricated via wet chemical methods, such as chemical co-precipitation, sol-gel and gel combustion. Green bodies may be formed using tape casting, slip casting, or gel casting as known to those skilled in the art. High pressure and high temperature sintering via techniques such as hot pressing, high pressure (HP) and hot isostatic pressure, spark plasma sintering, and microwave sintering, for example, may be used to increase the ceramic particle packing density. Thinning via lapping and/or polishing may be used to decrease surface roughness to achieve thin, highly optically transparent layers that are suitable for high displacement actuation.

A piezoelectric material may be poled to achieve a desired dipole alignment. According to some embodiments, an applied voltage may change the orientation of dipoles within the piezoelectric layers such that the piezoelectric layers may have a first orientation of dipoles when a first voltage is applied between the primary electrode and the secondary electrode, and a second orientation of dipoles different from the first orientation when a second voltage is applied between the primary electrode and the secondary electrode.

For piezoelectric polymers like PVDF homopolymer, the piezoelectric response may be tuned by altering the crystalline content and the crystalline orientation within the polymer matrix, e.g., by uniaxial or biaxial stretching, optionally followed by poling. In this regard, the origin of piezoelectricity in PVDF homopolymer may be associated with the β-phase crystallite polymorph, which is the most electrically active and polar of the PVDF phases. Alignment of the β-phase structure may be used to achieve the desired piezoelectric effect. Poling may be performed to align the β-phase and enhance the piezoelectric response. Other piezoelectric polymers, such as PVDF-TrFE and PVDF-TrFE-CFE may be suitably oriented upon formation and the piezoelectric response of such polymers may be improved by poling with or without stretching.

In some embodiments, multilayer actuators may include paired electrodes, which allow the creation of the electrostatic field that forces constriction of the piezoelectric layer(s). In some embodiments, an "electrode," as used herein, may refer to a conductive material, which may be in the form of a thin film or a layer. Electrodes may include relatively thin, electrically conductive metals or metal alloys and may be of a non-compliant or compliant nature.

In some embodiments, the electrodes may include a metal such as aluminum, gold, silver, tin, copper, indium, gallium, zinc, alloys thereof, and the like. An electrode may include one or more electrically conductive material, such as a metal, a semiconductor (such as a doped semiconductor), carbon nanotubes, graphene, carbon black, transparent conductive oxides (TCOs, e.g., indium tin oxide (ITO), zinc oxide (ZnO), indium gallium zinc oxide (IGZO), etc.), or other electrically conducting material.

In some embodiments, a primary electrode may overlap (e.g., overlap in a parallel direction) at least a portion of a secondary electrode. The primary and secondary electrodes may be generally parallel and spaced apart and separated by a layer of piezoelectric material. A tertiary electrode may overlap at least a portion of either the primary or secondary electrode.

In some embodiments, one or more electrodes may be optionally electrically interconnected, e.g., through a contact or schoopage layer, to a common electrode. In some embodiments, a stepped actuator may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer.

In some embodiments, a common electrode may be electrically coupled (e.g., electrically contacted at an interface having a low contact resistance) to one or more other electrode(s), e.g., a secondary electrode and a tertiary electrode located on either side of a primary electrode.

In some embodiments, one or more electrodes in a multimorph architecture may be independently connected to a suitable power source such that, during operation, different voltages may be applied to different piezoelectric layers. For instance, interlayer connections and applied potentials may be arranged such that the voltage across a multimorph may vary, e.g., linearly, from a first voltage along the centerline to a second voltage proximate to an upper surface of the actuator and a third voltage proximate to a lower surface of the actuator. By way of example, the first voltage may be approximately zero, while the second and third voltages may be maximum and minimum applied voltages, respectively.

In some embodiments, electrodes may be flexible and/or resilient and may stretch, for example elastically, when an actuator undergoes deformation. In this regard, electrodes may include one or more transparent conducting oxides (TCOs) such as indium oxide, tin oxide, indium tin oxide (ITO), IGZO, including flame-deposited IGZO, and the like, graphene, carbon nanotubes, etc. In other embodiments, relatively rigid electrodes (e.g., electrodes including a metal such as aluminum) may be used. In still further embodiments, electrodes may include one or more conducting or semiconducting polymers.

In some embodiments, the electrodes (e.g., the primary electrode and the secondary electrode) may have a thickness of approximately 1 nm to approximately 1000 nm, with an example thickness of approximately 10 nm to approximately 50 nm. In some embodiments, a common electrode may have a sloped shape, or may be a more complex shape (e.g., patterned or freeform). In some embodiments, a common electrode may be shaped to allow compression and expansion of an optical element or device during operation.

In some embodiments, the electrodes described herein (e.g., the primary electrode, the secondary electrode, or any other electrode including any common electrode) may be fabricated using any suitable process. For example, the electrodes may be fabricated using physical vapor deposition (PVD), chemical vapor deposition (CVD), evaporation, spray-coating, spin-coating, screen printing, atomic layer deposition (ALD), and the like. In further aspects, the electrodes may be manufactured using a thermal evaporator, a sputtering system, stamping, and the like.

In some embodiments, a layer of piezoelectric material may be deposited directly on to an electrode. In some embodiments, an electrode may be deposited directly on to the piezoelectric material. In some embodiments, electrodes may be prefabricated and attached to a piezoelectric material. In some embodiments, an electrode may be deposited on a substrate, for example a glass substrate or flexible polymer film. In some embodiments, the piezoelectric material layer may directly abut an electrode. In some embodiments, there may be a dielectric layer, such as an insulating layer, between a layer of piezoelectric material and an electrode. Any suitable combination of processes may be used.

According to certain embodiments, a stacked actuator may include a plurality of piezoelectric layers extending parallel to an x-y plane, where at least two of the piezoelectric layers have different dimensions in the x-y plane, such that the stacked structure tapers. In some embodiments, each piezoelectric layer of the stacked structure may be rectangular and each subsequent layer in the stack extends in one direction less than each previous layer such that the stacked actuator structure has a stepped profile in the one direction.

In some embodiments, each piezoelectric layer of a stacked structure may be rectangular and each subsequent piezoelectric layer in the stack above a centerline piezoelectric layer extends in one direction less than each previous piezoelectric layer, and each subsequent piezoelectric layer in the stack below the centerline piezoelectric layer also extends in one direction less than each previous layer, such that the stacked actuator structure has a stepped profile in the one direction.

The application of a voltage between the electrodes can cause deformation of the intervening piezoelectric layer(s). In some embodiments, an applied voltage (e.g., to the primary electrode and/or the secondary electrode) may create at least approximately 0.1% strain (e.g., an amount of deformation resulting from the piezoelectric response to the electric field, which is related to the applied voltage divided by the initial dimension of the material) in at least one direction (e.g., an x, y, or z direction with respect to a defined coordinate system).

The stepped actuator may be deformable from an initial state to a deformed state when a first voltage is applied between the primary electrode and the secondary electrode and may further be deformable to a second deformed state when a second voltage is applied between the primary electrode and the secondary electrode.

In some embodiments, the application of an electric field over an entirety of a piezoelectric layer may generate substantially uniform deformation between the primary and secondary electrodes. In some embodiments, the primary electrode and/or the secondary electrode may be patterned, allowing a localized electric field to be applied to a portion of the stepped actuator, for example, to provide a localized deformation.

A stepped actuator may include a plurality of stacked elements. For example, each element may include a piezoelectric layer disposed between a pair of electrodes. In some embodiments, an electrode may be shared between elements; for example, an actuator may have alternating electrodes and a piezoelectric layer located between neighboring pairs of electrodes. Various stacked configurations can be constructed in different geometries that alter the shape, alignment, poling direction, and spacing between elements. Such complex arrangements can enable compression, extension, twisting, and/or bending when operating the actuator.

As will be appreciated, features from any of the embodiments described herein may be used in combination with one another in accordance with the general principles described herein. These and other embodiments, features, and advantages will be more fully understood upon reading the following detailed description in conjunction with the accompanying drawings and claims.

Figure 4:
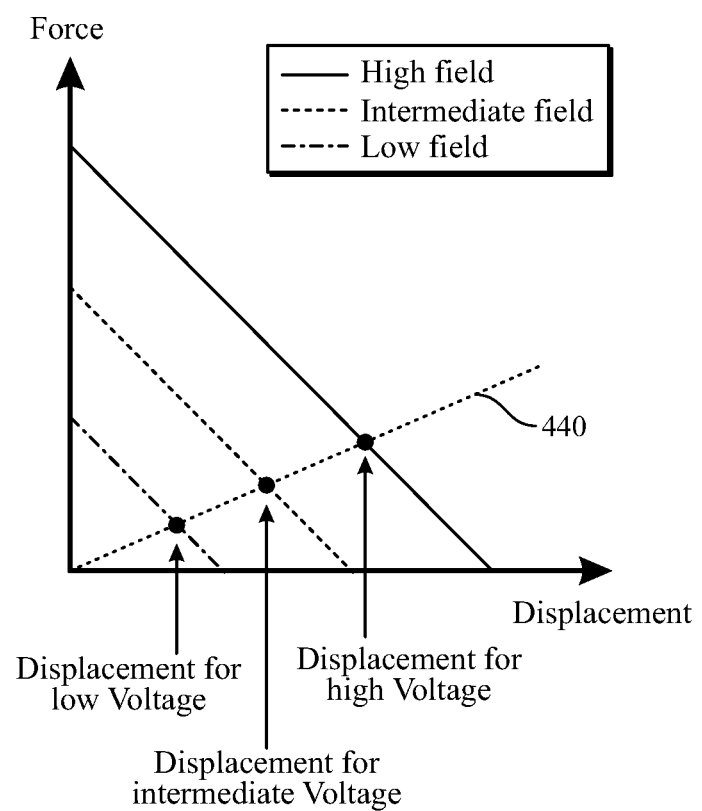
FIG. 4 is a plot of blocking force versus displacement showing the net displacement at a point along the actuator for an example stepped actuator according to some embodiments.
Figure 5:
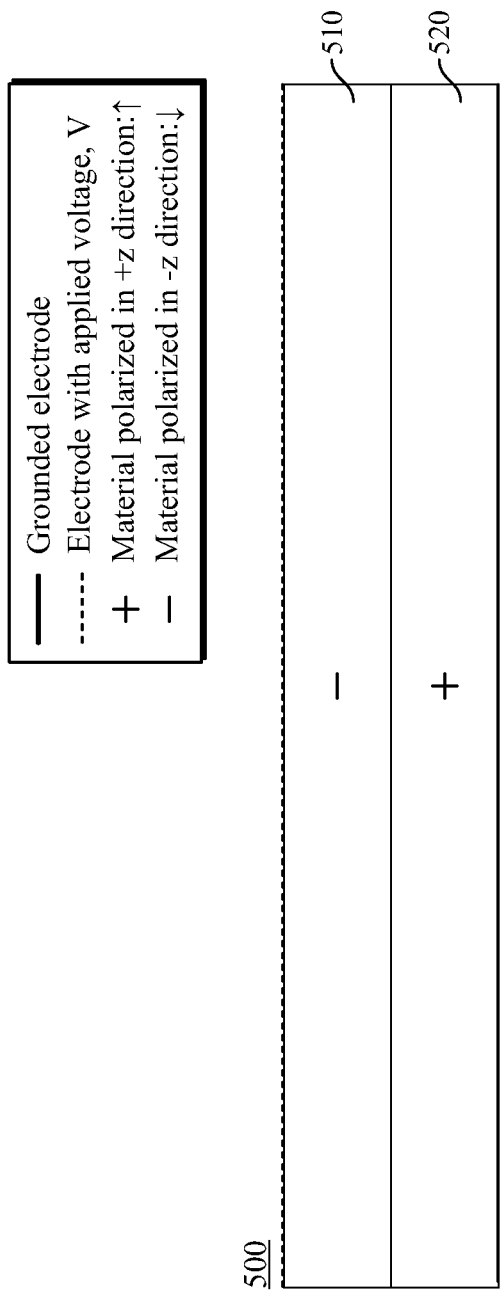
FIG. 5 is a schematic illustration of a comparative bimorph actuator.

The following will provide, with reference to FIGS. 1-27, a detailed description related to stepped piezoelectric actuators and associated methods of manufacture. The discussion associated with FIGS. 1 and 2 includes a description of the multilayer structure associated with example stepped piezoelectric actuators. The discussion associated with FIGS. 3 and 4 includes a description of the blocking curves associated with a stepped actuator. FIG. 5 shows a schematic representation of a comparative bimorph actuator. The discussion associated with FIG. 6 includes a description of the blocking curves for an exemplary stepped actuator and a comparative bimorph actuator. The discussion associated with FIG. 7 relates to the tip displacement and space requirement for exemplary (stepped) and comparative (planar) actuators.

The discussion associated with FIGS. 8-12 includes a description of stress profiles for stepped and comparative piezoelectric actuators. The discussion associated with FIGS. 13-17 includes a description of example methods of manufacturing a multilayer, stepped piezoelectric actuator. The discussion associated with FIGS. 18-21 includes a description of modeling parameters used to characterize piezoelectric actuators. The discussion associated with FIGS. 22-24 includes a description of stress profiles associated with stepped piezoelectric actuators. The discussion associated with FIGS. 25-27 relates to exemplary virtual reality and augmented reality devices that may include a stepped piezoelectric actuator.

Referring to FIG. 1, shown is a schematic cross-sectional illustration of two actuator structures, a stepped multimorph actuator 110 according to certain embodiments and a comparative (constant thickness) bimorph actuator 120. As will be discussed in further detail herein, performance advantages of the stepped multimorph actuator 110 relative to the comparative bimorph actuator 120 may be ascertained by modeling the application of an equivalent voltage per unit thickness to each actuator 110, 120, where the structures are assumed to have the same mass, width (e.g., 3 mm), and overall length.

Figure 2:
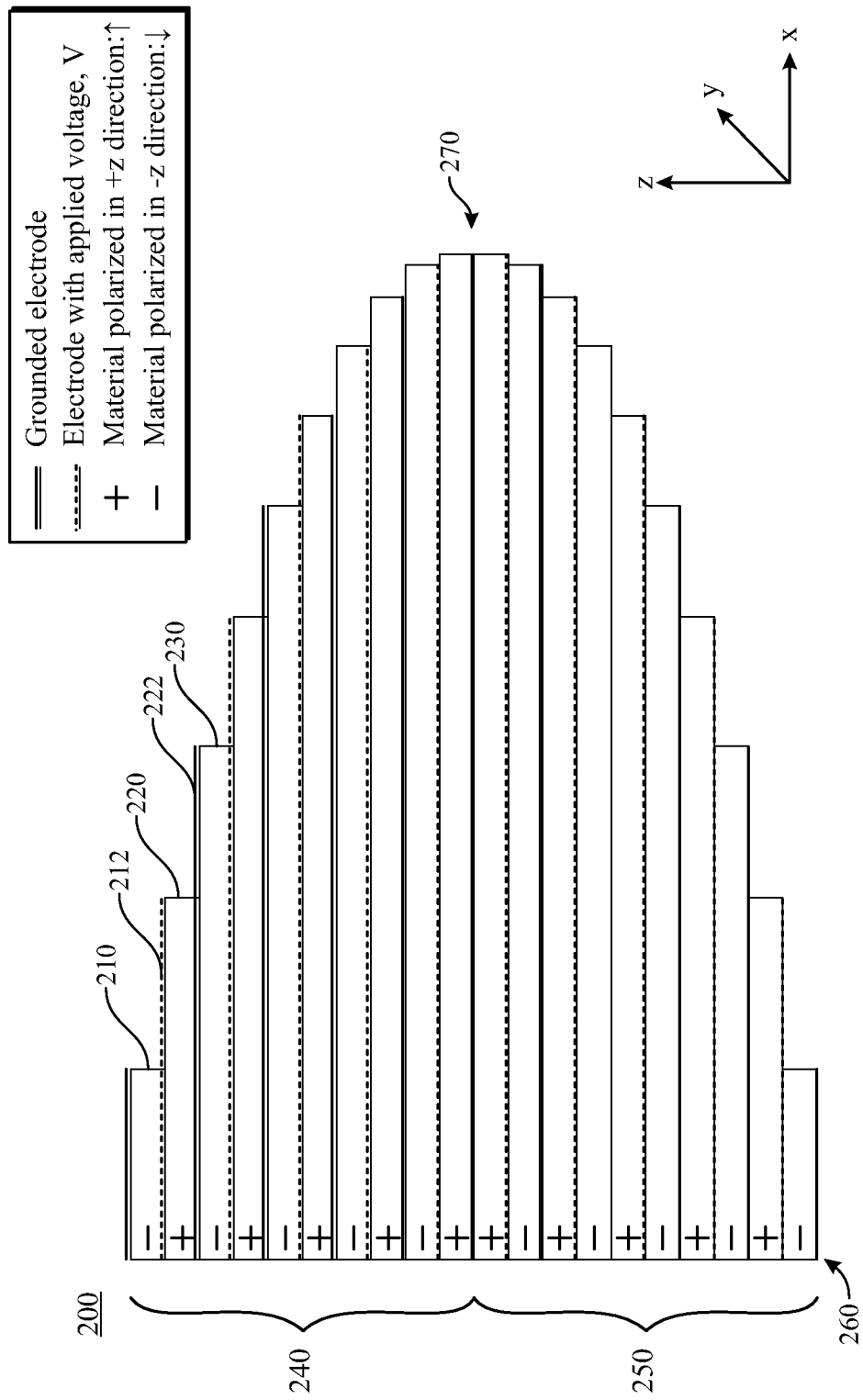
FIG. 2 depicts the structure of a stepped multimorph actuator according to various embodiments.

Referring to FIG. 2, shown is a detailed architecture of an example stepped multimorph actuator. Stepped multimorph actuator 200 includes a plurality of piezoelectric layers 210, 220, etc. and intervening electrodes 212, 222, etc. In certain embodiments, piezoelectric layers 210, 220, etc. may include a poled piezoelectric material. For instance, piezoelectric layers 210 may be poled in one direction, while piezoelectric layers 220 may be poled in an opposite direction.

As will be appreciated, a first layer 210 of piezoelectric material may have a substantially different length than an adjacent (second) layer 220 of piezoelectric material. The length disparity, i.e., along the x-direction, may form steps 230 along a surface of the actuator 200. In certain embodiments, a length difference (e.g., along the x-direction) between adjacent piezoelectric layers may be at least approximately 1%, e.g., 1%, 2%, 5%, 10%, 15%, 20%, or more, including ranges between any of the foregoing values. In certain embodiments, the width (e.g., along the y-direction) of the first layer 210 of piezoelectric material and the width of the second layer 220 of piezoelectric material may be substantially equal. As used herein, "substantially equal" values may differ by less than 1%. In certain embodiments, the width of the first layer 210 of piezoelectric material and the width of the second layer 220 of piezoelectric material may be unequal. In some embodiments, a thickness of the actuator at the base 260 (e.g., along a z-direction) may be at least approximately 10% greater than a thickness at the tip 270, e.g., 10%, 20%, 30%, 40%, 50%, or 60%, including ranges between any of the foregoing values. In alternate embodiments, a thickness of the actuator at the base may be less than a thickness at the tip. Referring still to FIG. 2, the plural piezoelectric layers may form a first multimorph 240 configured to exhibit a tensile state under an applied voltage, and a second multimorph 250 configured to exhibit a compressive state under an applied voltage.

Actuator 200 may be driven by applying a voltage across the piezoelectric layers. The applied voltage may cause the first multimorph 240 to expand or contract, while the second multimorph 250 may contract or expand. The relative expansion and contraction may induce motion of the actuator tip 270 (i.e., distal end) relative to the actuator base 260.

Figure 3:
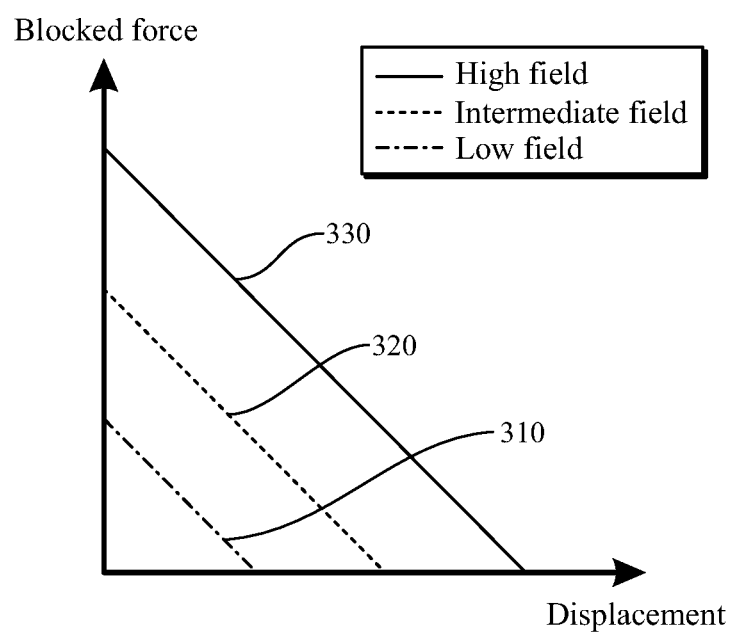
FIG. 3 is a plot of blocking force versus displacement for an example stepped actuator according to some embodiments.

Shown in FIG. 3 is a plot of force versus displacement for different applied voltages (i.e., low field, intermediate field, or high field). Each blocking force curve 310, 320, 330 represents the blocking force as a function of displacement at a given voltage. As will be appreciated by those skilled in the art, the gradient of the blocking force curves may be determined by the stiffness of the actuator.

When an actuator is connected to a load characterized by a certain stiffness, the blocking curve determines the displacement that can be obtained. With reference to FIG. 4, as the voltage applied to an actuator with a given load is changed, the intersection of the load line 440 with the blocking force curves may be used to determine the achievable displacement.

FIG. 5 shows the electrode and piezoelectric layer configurations for a comparative, constant thickness bimorph actuator 500. In the model used to simulate performance and compare constant thickness and stepped actuators, the thickness of each piezoelectric layer 510, 520 in the comparative bimorph actuator 500 is greater than the individual layer thicknesses for the stepped multimorph actuator 200 from FIG. 2, such that the actuators 200, 500 have equivalent mass. Moreover, actuation is modeled using the same voltage gradient (V/µm).

Figure 6:
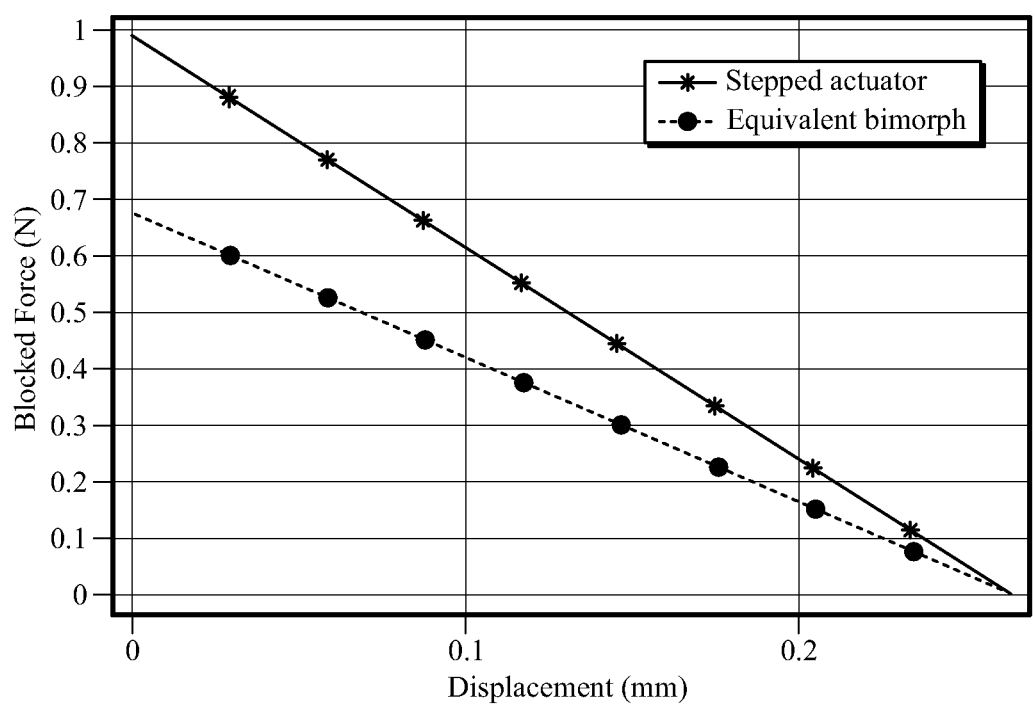
FIG. 6 is a plot of blocked force versus displacement for (a) an example stepped actuator according to certain embodiments, and (b) a comparative bimorph actuator.

Referring to FIG. 6, shown is a plot of blocking force versus displacement for each of the stepped and comparative bimorph actuators. The stepped actuator data represents an actuator design having a maximum zero displacement blocking force. As will be appreciated, the stepped actuator exhibits a better blocked force versus displacement characteristic than the equivalent comparative bimorph actuator. In certain embodiments, the length of the steps may be changed to, for example, increase displacement with lower zero displacement blocking force.

Figure 7:
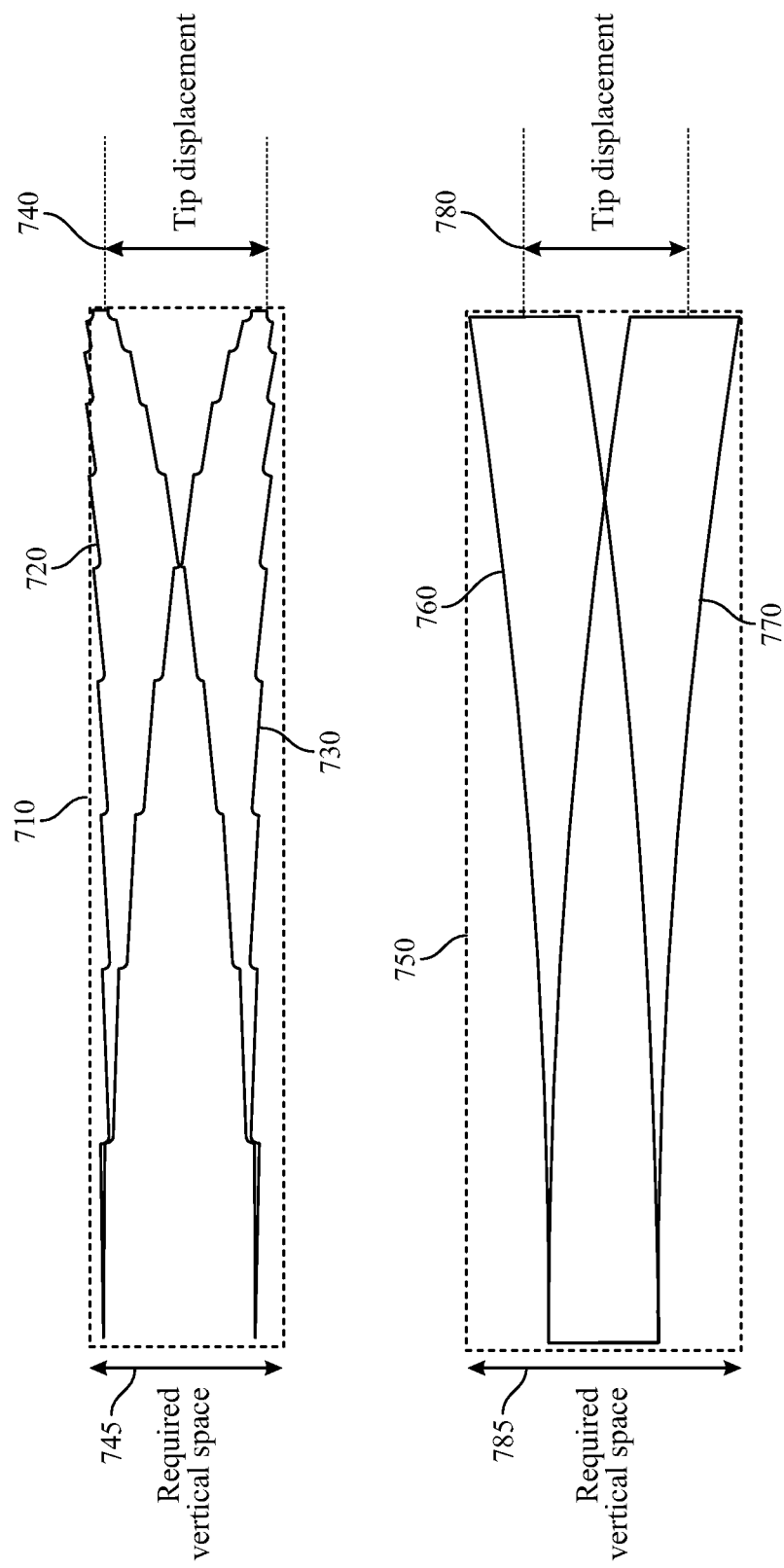
FIG. 7 is a schematic illustration showing tip displacement for (a) a stepped multimorph actuator according to various embodiments, and (b) a comparative bimorph actuator.

A comparison of the displacement kinematics associated with both the stepped and comparative bimorph actuators is shown schematically in FIG. 7. For purposes of comparison, the illustrated actuators have the same mass. Each actuator structure is shown at two extreme positions, corresponding to the full range of motion. For example, within reference frame 710, the stepped actuator position is shown at a maximum positive displacement 720 and at a maximum negative displacement 730, which correspond to a total tip displacement 740. The required vertical space to achieve the maximum range of motion is indicated by arrow 745.

Also shown in FIG. 7 are the maximum positive displacement 760 and the maximum negative displacement 770 positions of a comparative (planar) bimorph actuator. The comparative actuator may generate a total tip displacement 780 and deflects within a required vertical space 785 as indicated by the reference frame 750.

According to some embodiments, and as illustrated in FIG. 7, to achieve the same total tip displacement, the required vertical space 745 of the stepped actuator may be less than the required vertical space 785 of the comparative actuator. That is, for an equivalent total tip displacement, the stepped actuator requires substantially less vertical space than the constant thickness actuator, which may be beneficial in applications having limited available space. In certain embodiments, to achieve a comparable tip displacement, the required vertical space for the stepped actuator may be approximately 50% or more (e.g., 50%, 60%, 70% or 80%) less than the required vertical space for the comparative (planar) actuator.

Figure 8:
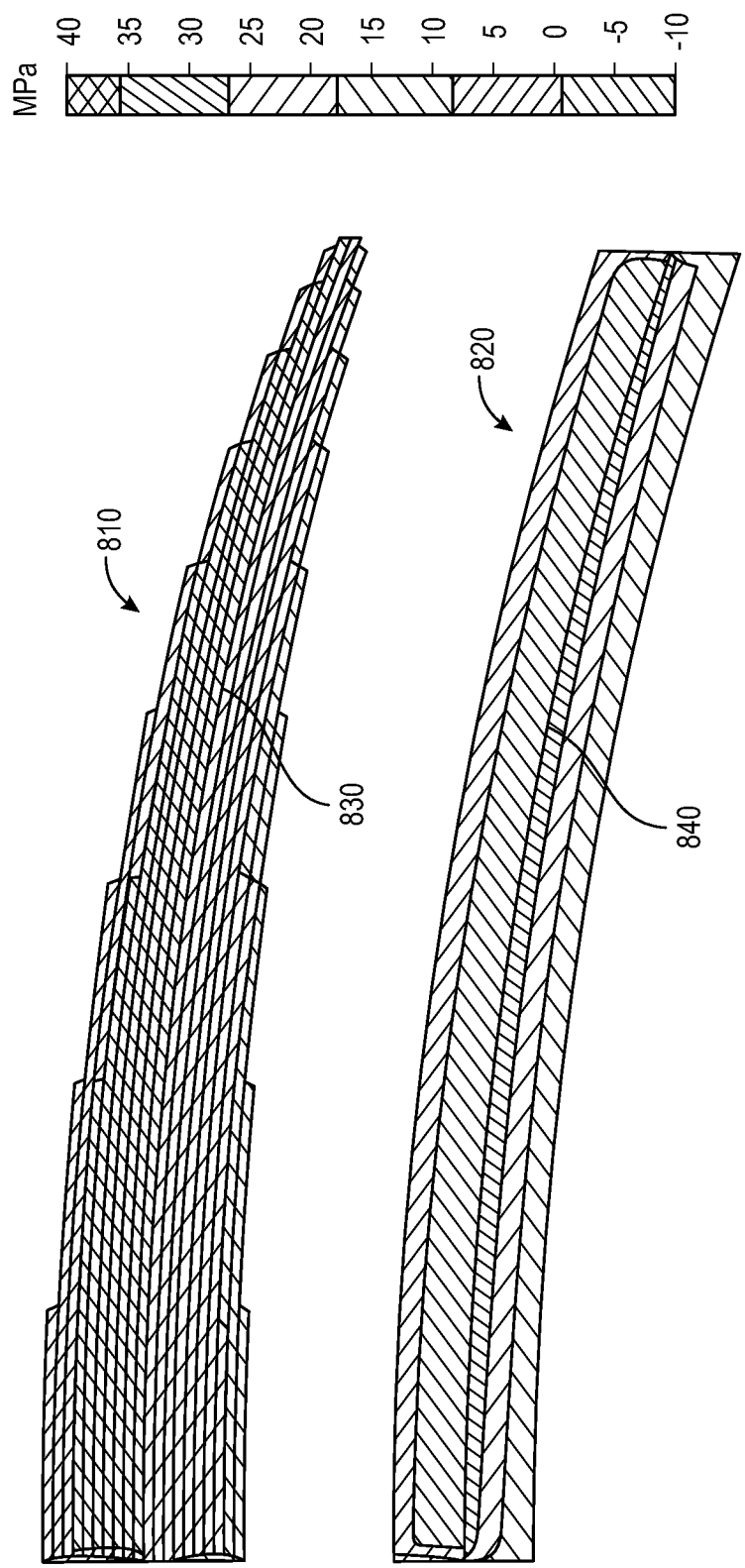
FIG. 8 is a schematic representation of the stress profile distribution during bending in an unblocked configuration for (a) a stepped multimorph actuator according to various embodiments, and (b) a comparative bimorph actuator.

Referring to FIG. 8, according to some embodiments, in an unblocked configuration, the stepped actuator 810 peak stresses 830 may be significantly lower than peak stresses 840 present in the equivalent constant thickness comparative bimorph actuator 820. Lower peak stresses may be associated with higher mechanical robustness during operation and a lower propensity for strain-induced failure.

Figure 9:
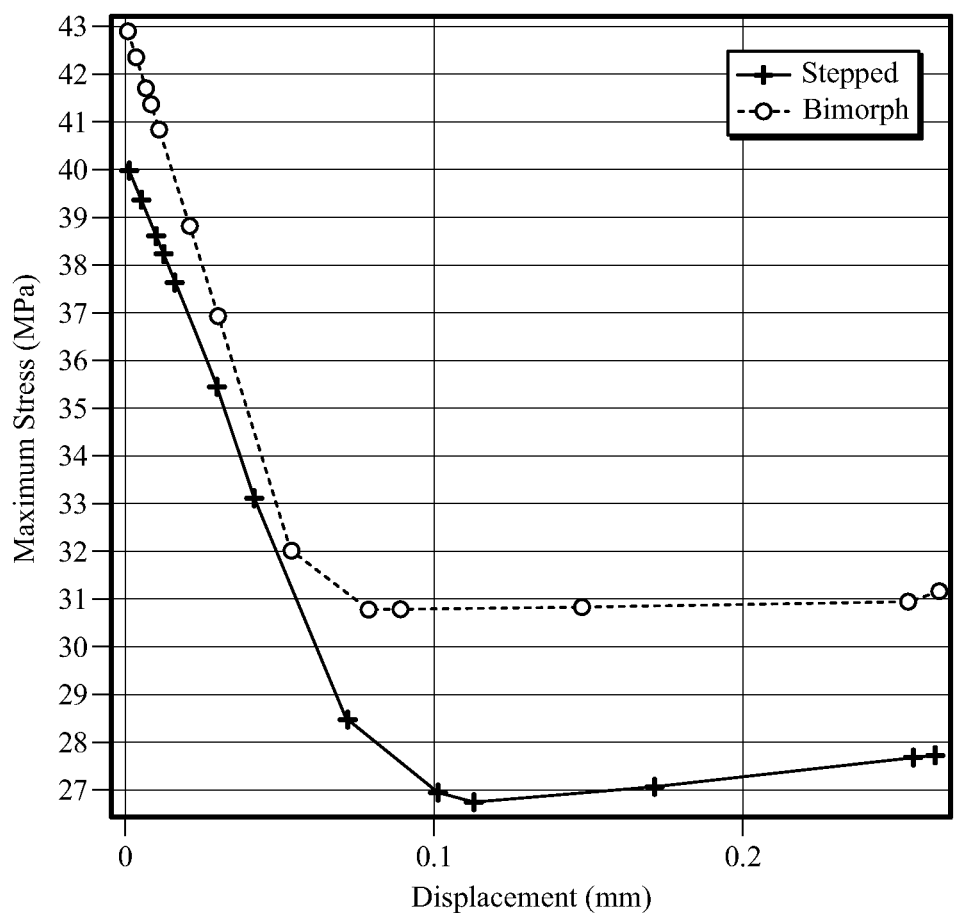
FIG. 9 is a plot of maximum stress versus displacement for (a) a stepped multimorph actuator according to various embodiments, and (b) a comparative bimorph actuator.

FIG. 9 is a plot comparing the maximum first principal stress for the stepped multimorph actuator with the mass equivalent comparative bimorph actuator. For the illustrated data, stresses within the stepped actuator may be less than and more evenly distributed than those in the comparative (planar) bimorph actuator, resulting in a lower maximum tensile stress in the piezoelectric layers, which may allow the stepped actuator to operate at higher voltages and/or decrease the likelihood of failure.

Figure 10:
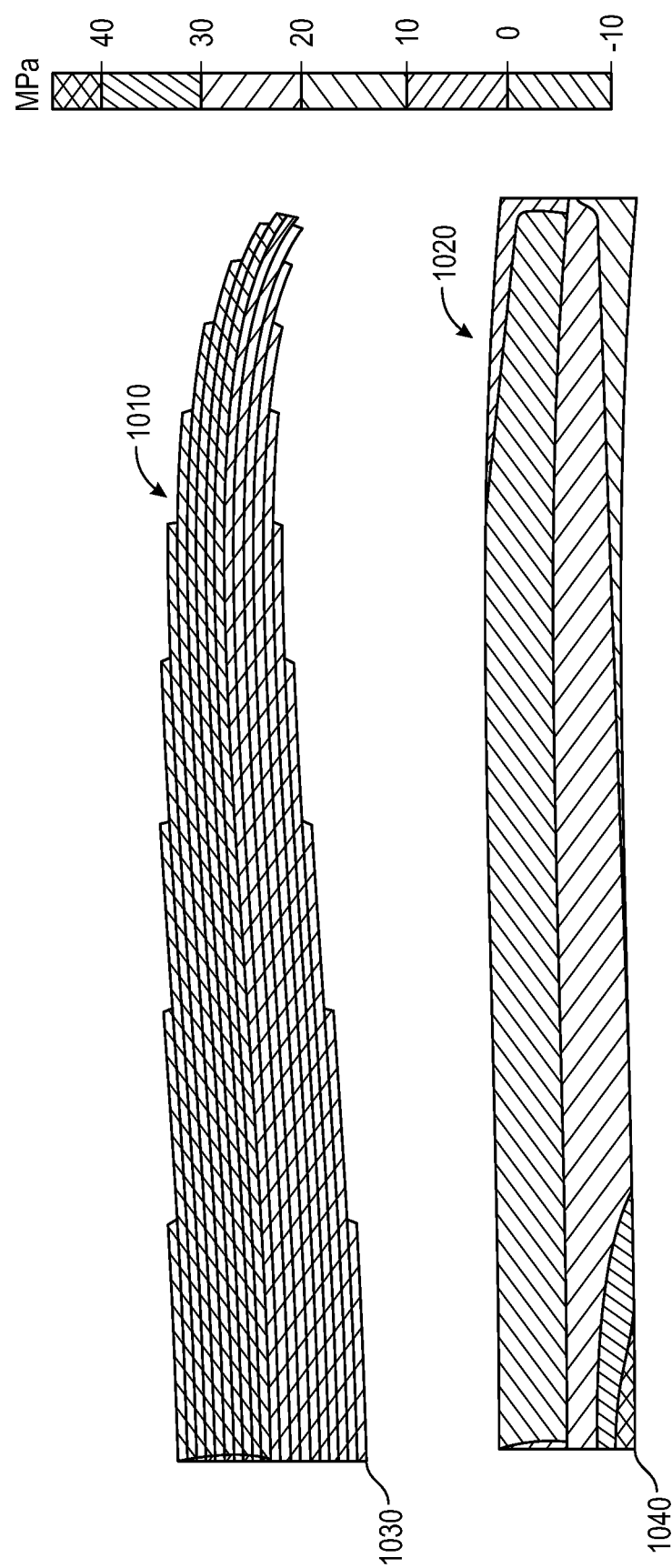
FIG. 10 is a schematic representation of the stress profile distribution during bending in a blocked configuration for (a) a stepped multimorph actuator according to various embodiments, and (b) a comparative bimorph actuator.

Referring to FIG. 10, according to further embodiments, in a blocked configuration, i.e., where the actuator tip (distal end) is fixed, the stepped actuator 1010 peak stresses 1030 may be significantly lower than peak stresses 1040 present in the equivalent constant thickness comparative bimorph actuator 1020.

Figure 11:
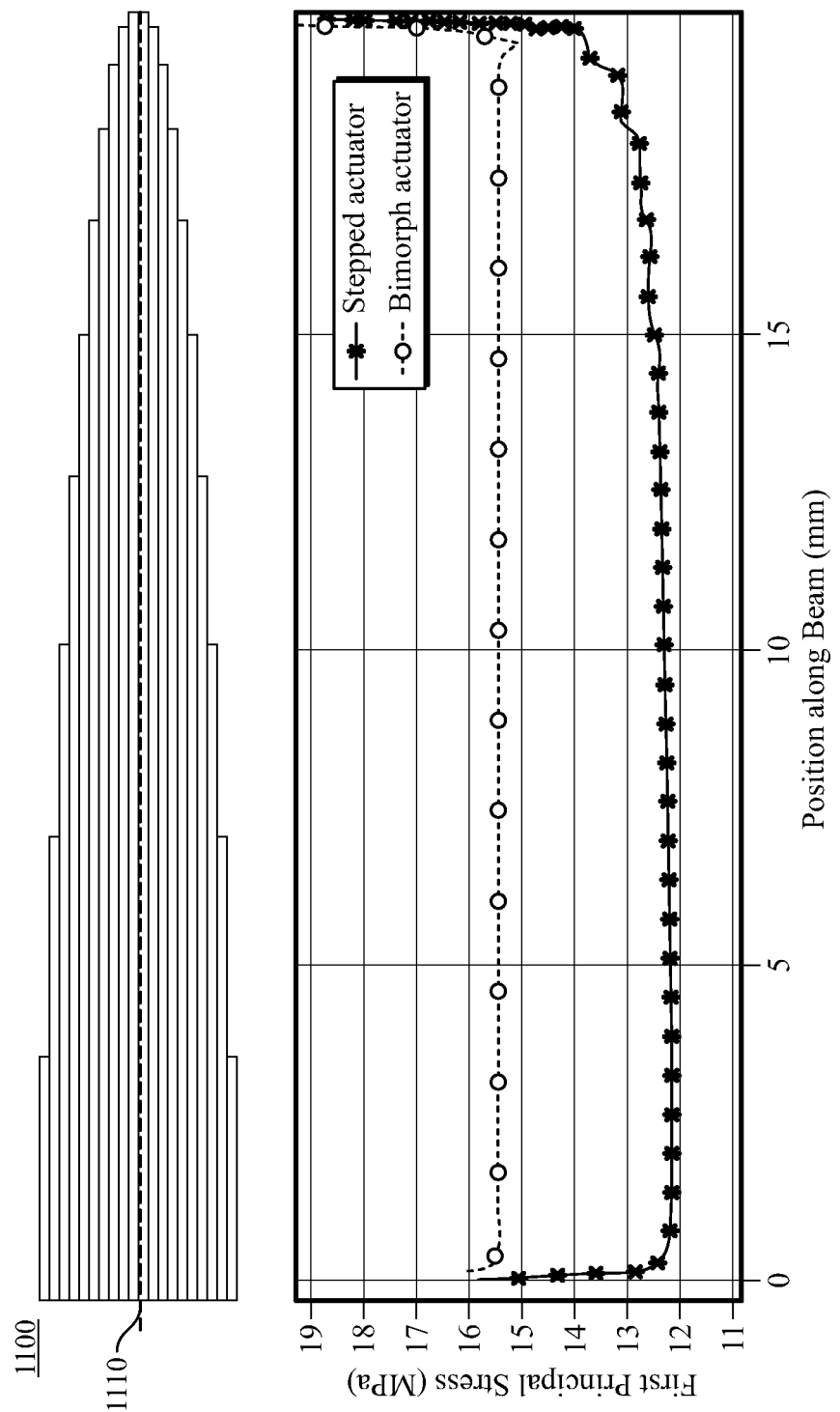
FIG. 11 is a plot of stress versus position along an actuator centerline for bending in an unblocked configuration for (a) a stepped multimorph actuator according to various embodiments, and (b) a comparative bimorph actuator.

FIG. 11 is a plot comparing the first principal stress along symmetry plane (centerline) 1110 of stepped multimorph actuator 1100 in an unblocked configuration. This centerline plane is the location of highest stresses in the unblocked configuration. The FIG. 11 data show that the first principal stress is substantially lower in the stepped multimorph actuator than along the centerline of a constant thickness comparative bimorph actuator (not shown).

Figure 12:
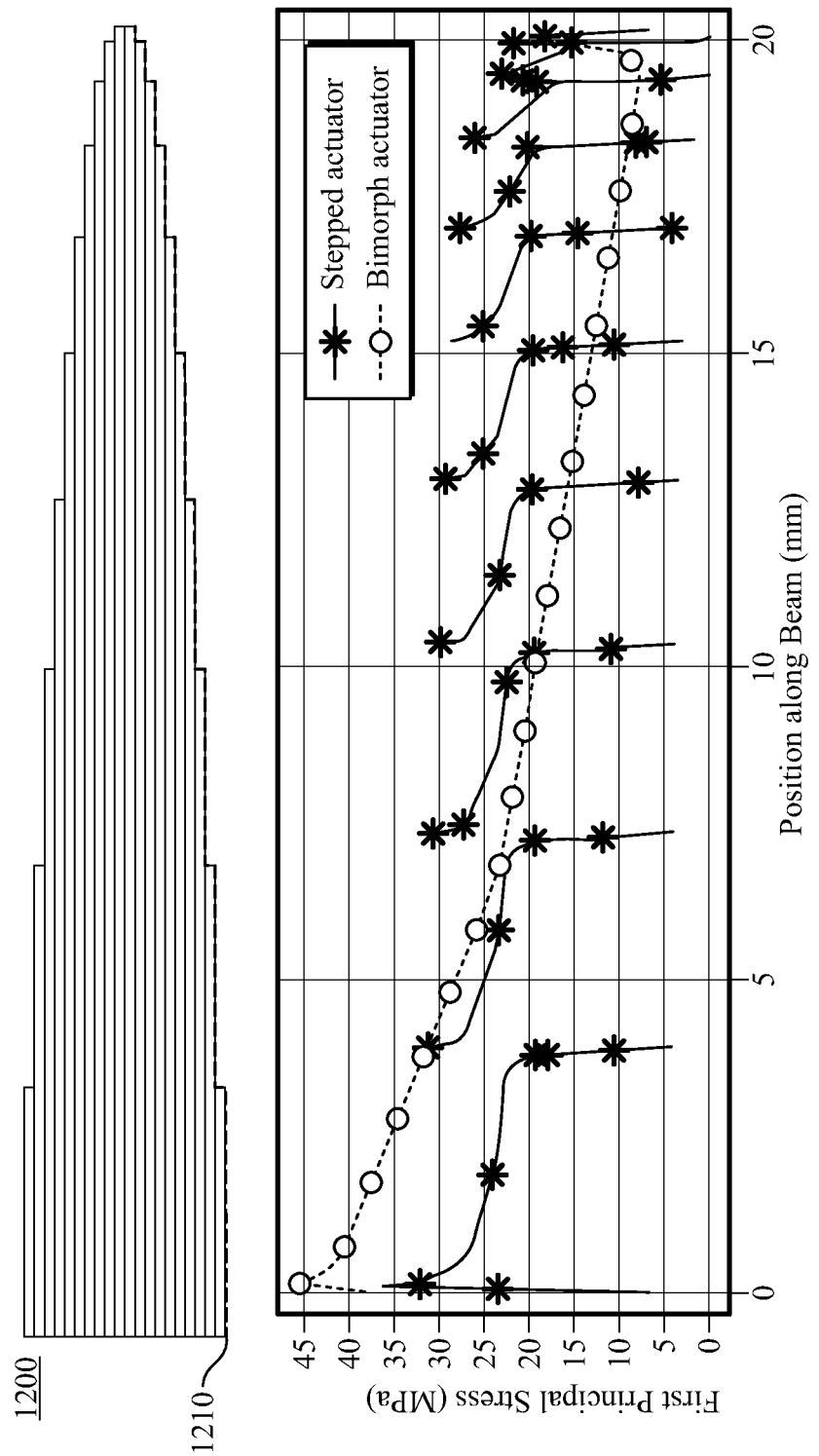
FIG. 12 is a plot of stress versus position along an actuator surface for bending in a blocked configuration for (a) a stepped multimorph actuator according to various embodiments, and (b) a comparative bimorph actuator.

FIG. 12 provides a comparison in a blocked configuration of the first principal stress along a surface 1210 of an example stepped multimorph actuator 1200 with that of a comparative, constant thickness bimorph actuator (not show). The surface 1210 is the location of highest stresses in the blocked configuration. The FIG. 12 data show that the first maximum principal stress may be substantially lower in the stepped multimorph actuator.

Figure 13:
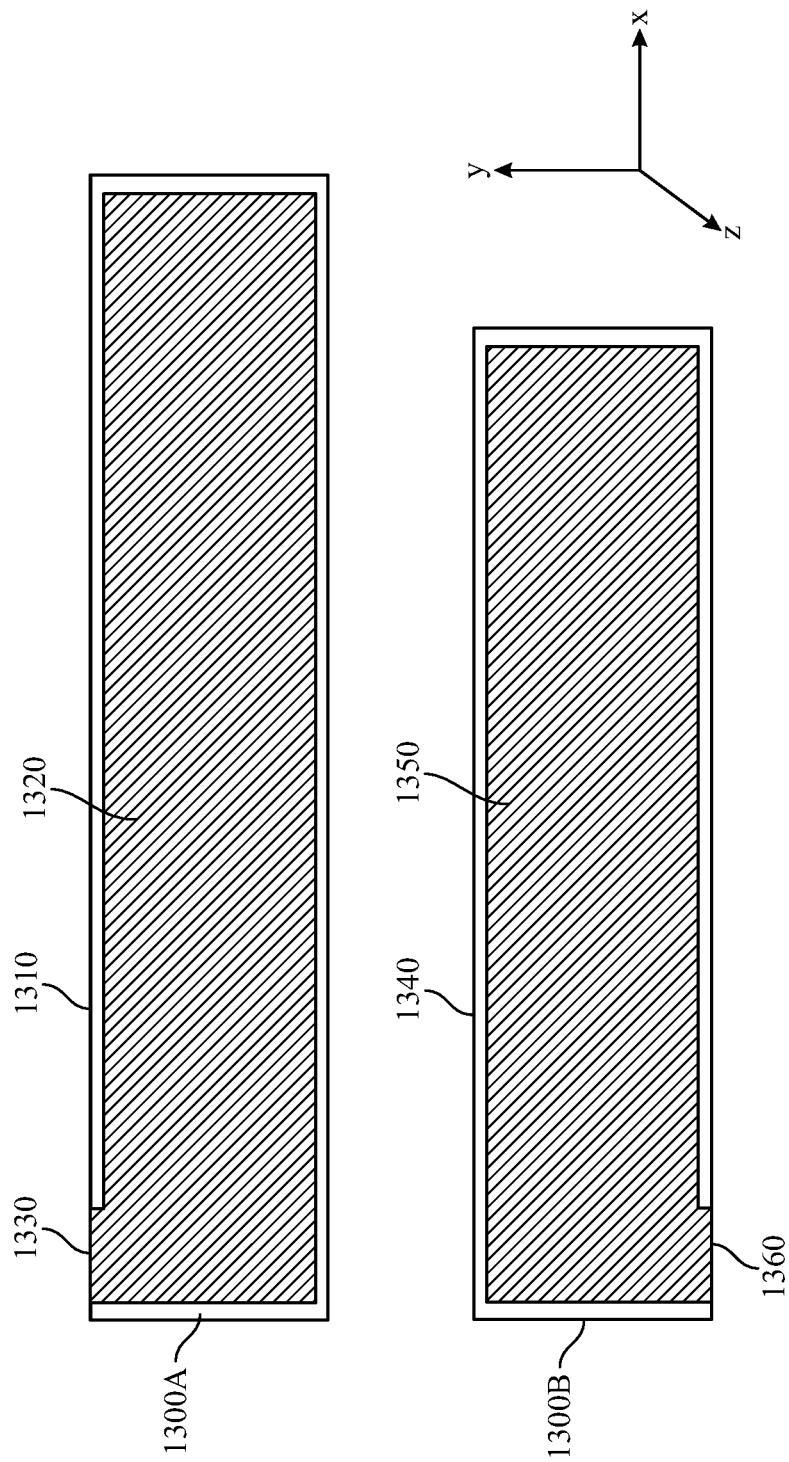
FIG. 13 is a schematic top-down illustration of individual electroded piezoelectric layers prior to bonding to form a stepped piezoelectric actuator according to some embodiments.

Referring to FIG. 13, according to some embodiments, a stepped actuator may be fabricated as a stack of alternating layers of piezoelectric material and conductive electrodes. Depicted in FIG. 13 are electroded layers of piezoelectric material showing an electrode configuration according to some embodiments. As disclosed herein, the piezoelectric material may include a ceramic, a polymer, or a combination thereof.

A layer of ceramic piezoelectric material may be formed initially as a green sheet from a slurry containing, for example, a piezoelectric precursor powder, binder, and a liquid carrier or solvent. Suitable binders include acrylates, epoxies, sol gels, or ceramic pastes. The slurry may optionally include additional materials, such as a surfactant and/or a plasticizer.

According to certain embodiments, the slurry may be formed into a sheet by casting, molding, calendaring, doctor blading, or other suitable process. The sheets may be coated with an electrode material forming a desired pattern on the sheet. The electrode material may include any suitable electrically conductive material and may be applied to one or both sides of the sheet using, for example, screen printing, inkjet printing, doctor blading, etc.

A ceramic sheet may be shaped using any suitable method, including die cutting, laser cutting, water jet cutting, slicing, or other process. In certain embodiments, the ceramic sheet may be shaped and electrode material applied to the shaped sheet. In alternate embodiments, the electrode material may be applied to the ceramic sheet prior to shaping.

Electroded ceramic sheets may be sintered and densified by applying pressure at an elevated temperature. For instance, a stack of electroded green bodies may be densified using a suitable mold, such as by the application of hydrostatic pressure. In some embodiments, a binder may be removed by heating the mold and the stack of ceramic sheets to between approximately 250° C. and approximately 500° C., and the ceramic may be sintered at a temperature of between approximately 800° C. and approximately 1300° C. A mold may be used to apply uniaxial pressure during sintering or "hot pressing." According to some embodiments, a multilayer stack may be formed by laminating ceramic/metal layers before or after sintering.

In some embodiments, conductors may be applied to the base of the stacked actuator to connect common electrodes amongst the ceramic layers. The conductors may be applied by dip coating, spray coating, doctor blading, brush applications, or transfer processes, for example. Insulators and mechanical attachments may be affixed to the base, or proximate to the base of the actuator. Conductors (schoopage) may be applied before and/or after sintering.

The densified (sintered) ceramic forms may be poled by applying an electric field at elevated temperature for a finite duration.

Referring to FIG. 13, shown are two individual green sheets 1300A, 1300B of a piezoelectric material. First sheet 1300A has a first length 1310 (i.e., along an x-direction) and a first electrode 1320 formed over a majority of a surface thereof, while second sheet 1300B has a second length 1340 (i.e., along the x-direction) less than the first length 1310 and a corresponding second electrode 1350 formed over a majority of a surface thereof. In the illustrated embodiment, green sheets 1300A, 1300B have substantially the same width (i.e., along a y-direction). As shown in the illustrated embodiment, a contact portion 1330, 1360 of each respective electrode 1320, 1350 may extend to an edge of the ceramic sheets 1300A, 13006, e.g., along opposite edges, which allows independent external connections to be made with each of the electrodes.

Figure 14:
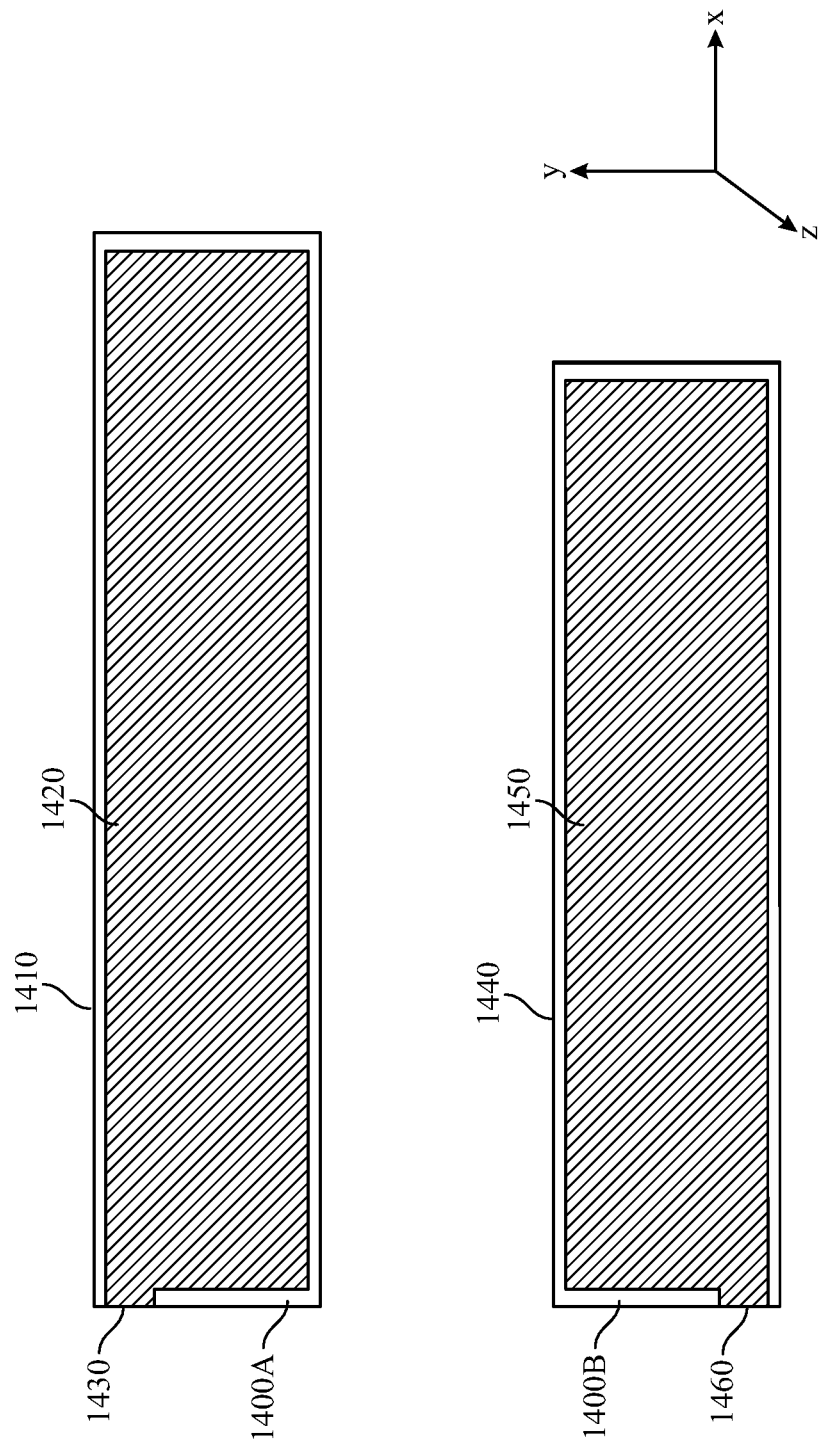
FIG. 14 is a schematic top-down illustration of individual electroded piezoelectric layers prior to bonding to form a stepped piezoelectric actuator according to further embodiments.

Referring to FIG. 14, shown are first and second green sheets 1400A, 1400B of a piezoelectric material having an alternate electrode configuration. As in the previous embodiment, first sheet 1400A has a first length 1410 (i.e., along the x-direction) and a first electrode 1420 formed over a majority of a surface thereof, and second sheet 1400B has a second length 1440 (i.e., along the x-direction) less than the first length 1410 and a corresponding second electrode 1450 formed over a majority of a surface of the second sheet 14006. Green sheets 1400A, 14006 may have substantially the same width (i.e., along a y-direction). A contact portion 1430, 1460 of each respective electrode 1420, 1450 may extend to adjacent edges of the ceramic sheets 1400A, 1400B. Contact portions 1430, 1460 of the electrodes 1420, 1450 may be laterally offset, i.e., along the y-direction, which in an assembled actuator allows independent external connections to be made with each of the electrodes 1420, 1450.

Figure 15:
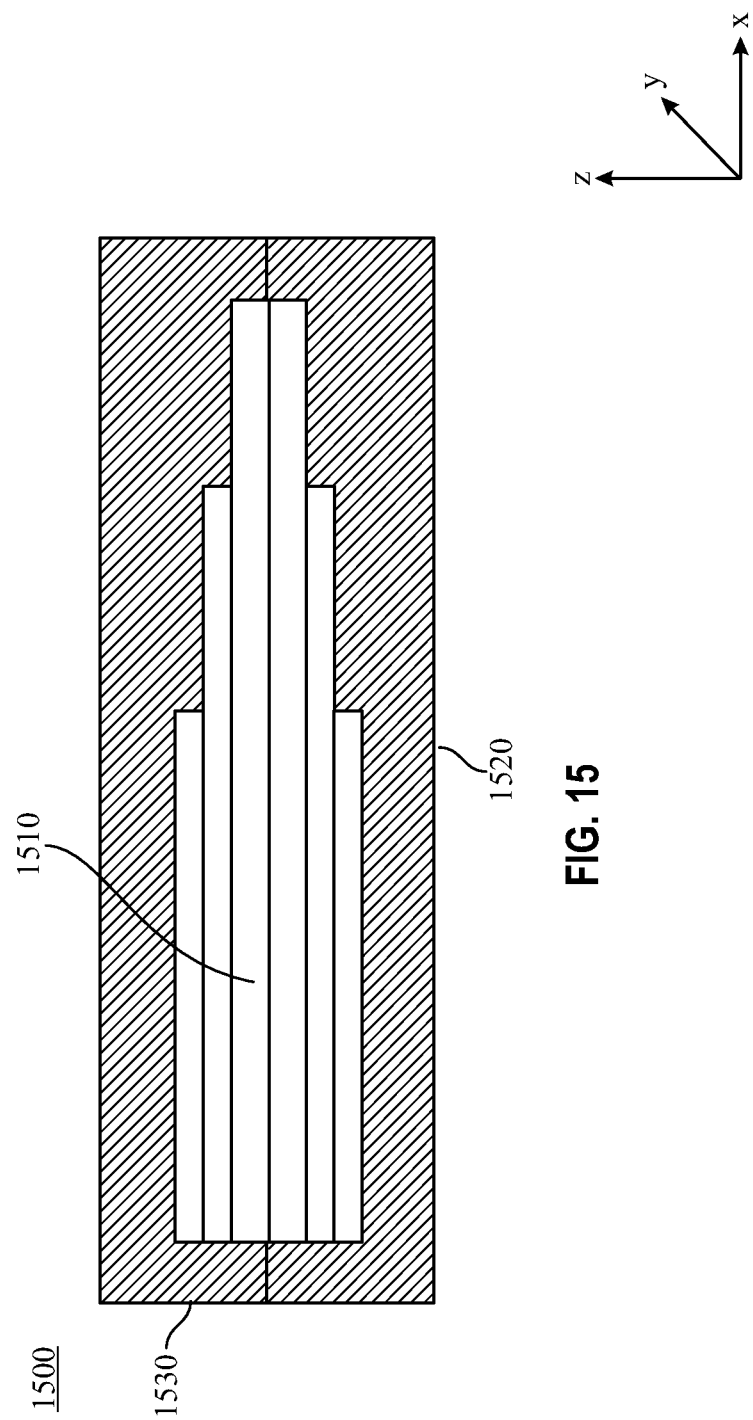
FIG. 15 shows a multilayer stepped actuator assembly laid up within a mold according to certain embodiments.
Figure 16:
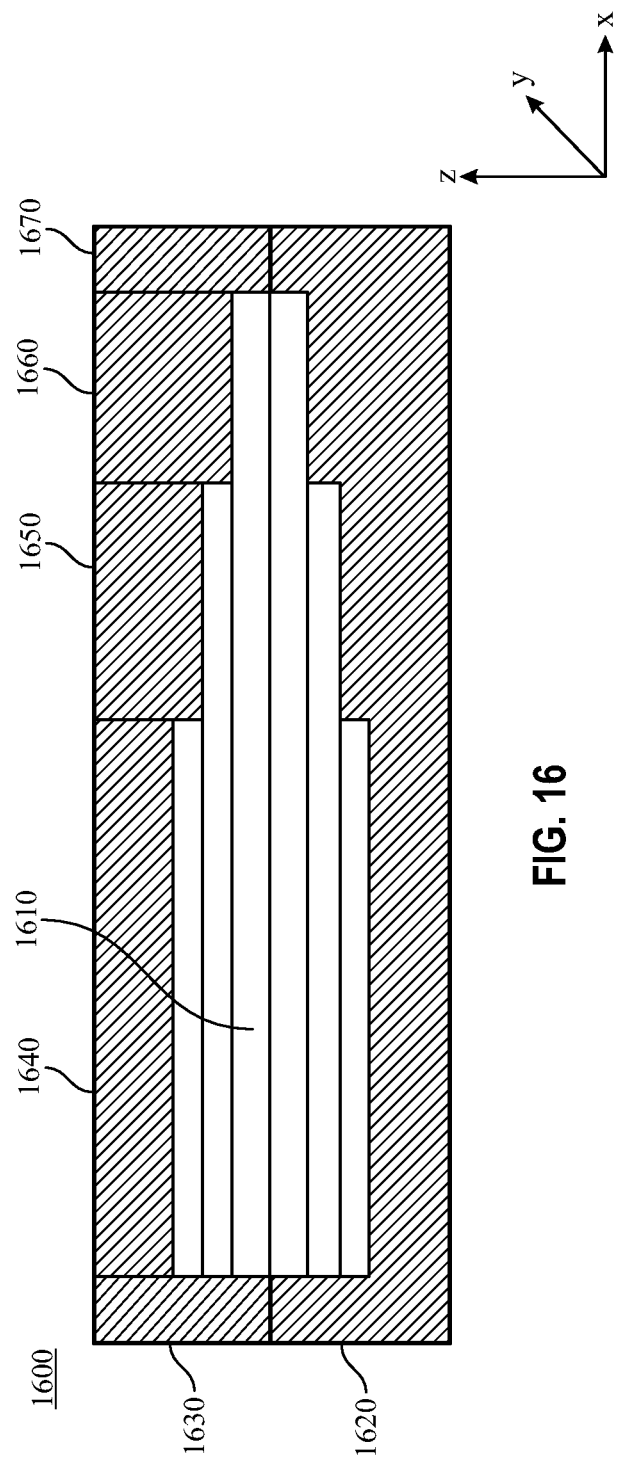
FIG. 16 shows a multilayer stepped actuator assembly laid up within a segmented mold according to some embodiments.

An example apparatus for manufacturing a stepped actuator is shown in FIG. 15. According to some embodiments, a stack of electroded green sheets 1510 may be laid up in a mold 1500. Mold 1500 may include a lower portion 1520 and a mating upper portion 1530 that are configured to form a compressed stack of green sheets 1510 within the mold. A further example mold geometry is shown in FIG. 16. Mold 1600 may include a lower portion 1620 and a segmented upper portion having independently moveable components 1630, 1640, 1650, 1660, 1670, etc. which may be configured to uniformly compress green sheet stack 1610 disposed within the mold 1600.

Figure 17:
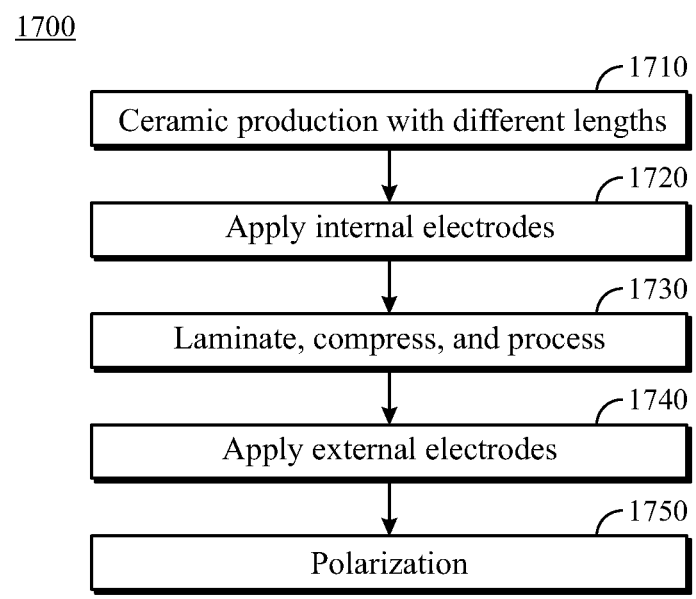
FIG. 17 is a flow chart depicting an example method for forming a stepped multimorph actuator according to various embodiments.

An example method of forming a stepped piezoelectric actuator is outlined in the flowchart of FIG. 17. Method 1700 includes forming a plurality of piezoelectric green sheets of varying length (step 1710), forming electrodes over the green sheets (step 1720), assembling the electroded green sheets into a multilayer stack and densifying (sintering) the stack (step 1730), forming electrical contact to the respective electrodes (step 1740), and polarizing the piezoelectric material (step 1750).

Figure 18:
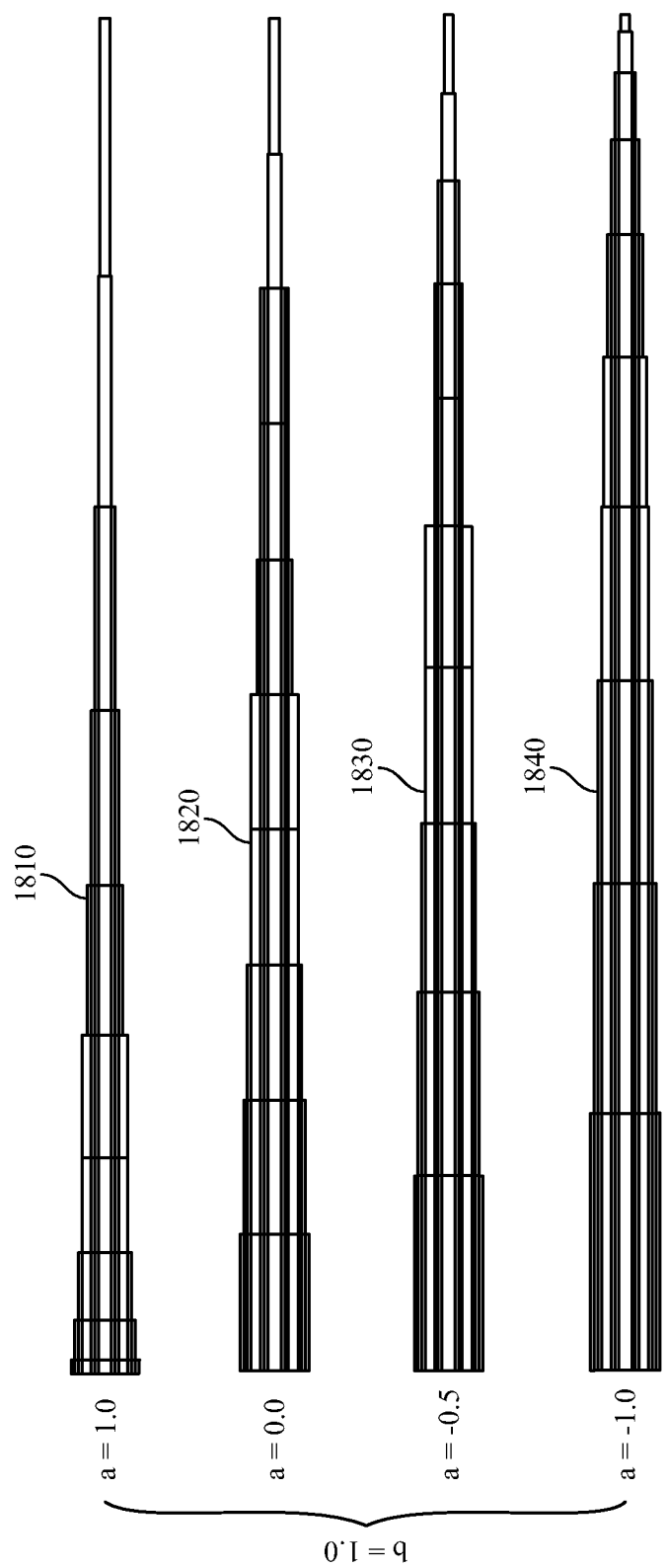
FIG. 18 shows example stepped actuator designs according to some embodiments.
Figure 19:
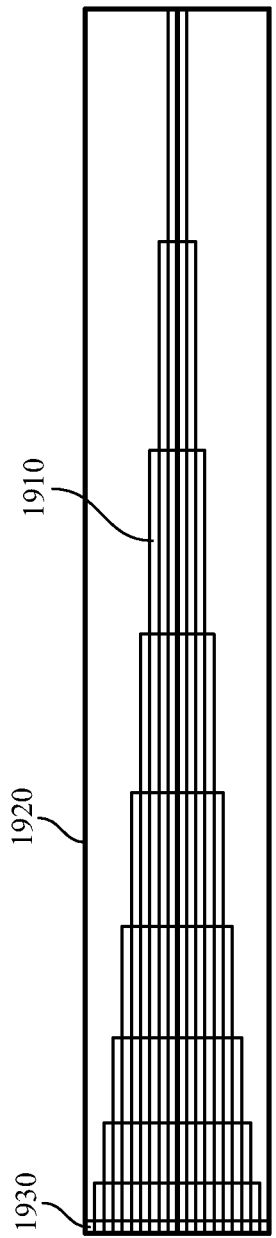
FIG. 19 shows an example stepped actuator design according to some embodiments.
Figure 20:
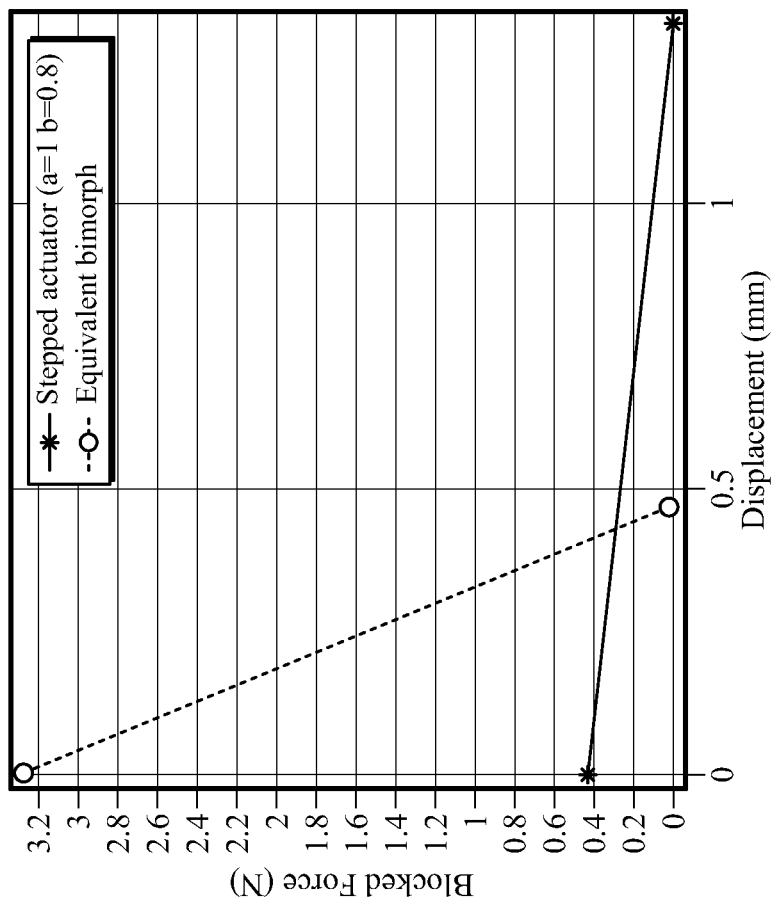
FIG. 20 is a plot of force versus displacement for (a) a stepped multimorph actuator according to certain embodiments, and (b) a comparative bimorph actuator.

Referring to FIG. 18, shown is a series of parameterized stepped multimorph actuators where the relative step length may be modeled by exemplary function, $f(x)=abx^2+(b-ab)x+(1-b)$ (Equation 1). In examples where the parameter b is equal to 1, it will be appreciated that the actuator shape is increasingly blunt for decreasing values of the parameter a. In the illustrated embodiments, the step distribution associated with actuator designs 1810, 1820, 1830 and 1840 corresponds to a parameter a equal to 1.0, 0.0, −0.5, and −1.0, respectively. A further example stepped multimorph actuator 1910 corresponding to a=1.0 and b=0.8 is shown in FIG. 19, which additionally illustrates the cross-sectional shape of a comparative bimorph actuator 1920 where the stepped multimorph actuator 1910 and the comparative (planar) bimorph actuator 1920 have the same thickness at base 1930. A plot of blocked force versus displacement comparing the stepped multimorph actuator 1910 with the comparative (planar) bimorph actuator 1920 is shown in FIG. 20. Relative to the comparative bimorph actuator 1920, the displacement and the blocking force for the stepped multimorph actuator 1910 may be increased by approximately 180% and decreased by approximately 80%, respectively.

In some applications, the steps between layers of the piezoelectric material may create stress concentrations, which may limit the actuator's maximum displacement or force, or both. Examples of applications that may create additional stresses include those where an external force is applied, for example, inertial forces in high-speed applications, and when applying a negative spring. A negative spring is a controlled force that may be applied to an actuator where the force increases in the direction of travel of the tip as a function of the travel. According to various embodiments, the stepped designs for the presently-disclosed piezoelectric actuators may enable a decrease in blocking force as a trade-off for an increase in displacement.

As used herein, a "negative spring" may, in some examples, refer to a spring that exhibits global or local negative stiffness. Thus, in certain embodiments, over some range of actuator stroke, the change in force and the change in displacement (as seen by the actuator) may be of opposite sign. This may be achieved using through coupling with a load offset, for example, using a pre-compressed spring or an engineered guide path contour, or by using a non-linear spring. In each case, the negative spring may induce a local effect that is exhibited over a particular range of a force-displacement curve.

Figure 21:
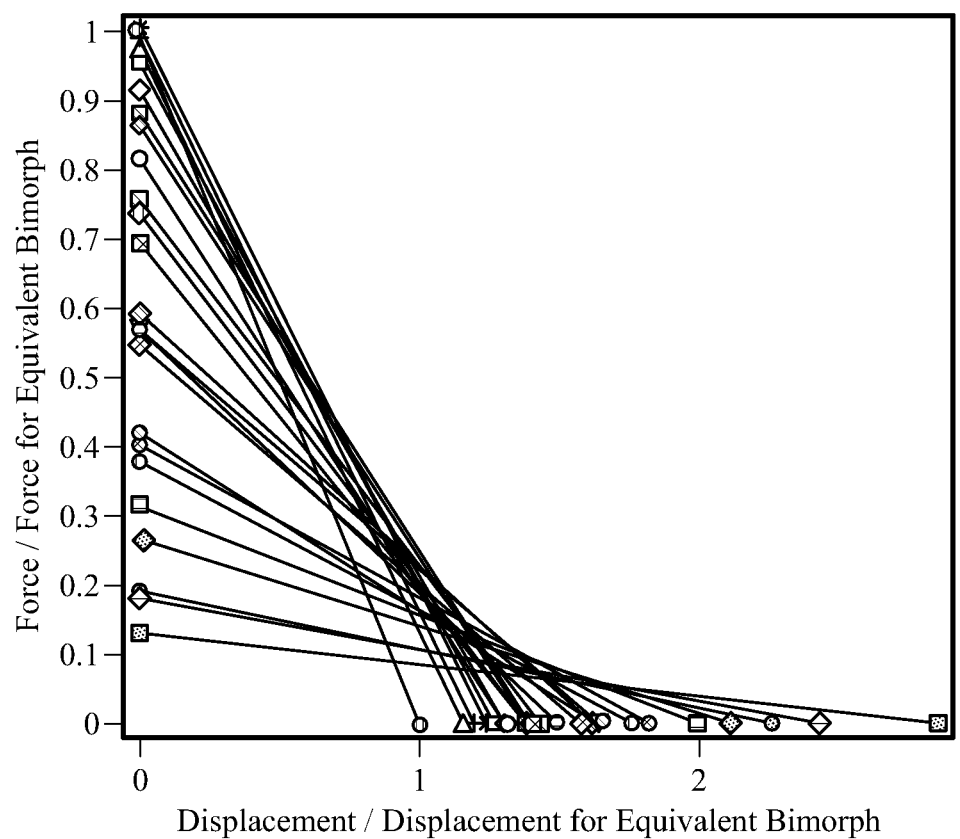
FIG. 21 is a plot of normalized force versus normalized displacement for various stepped multimorph actuator structures in accordance with some embodiments.

Referring to FIG. 21, shown is a family of normalized force versus displacement curves for a range of stepped multimorph actuator parameters where the actuator base height is constant. That is, each curve in FIG. 21 represents a different combination of the parameters a and b from Equation 1. The data illustrate the trade-off between an achievable blocking force and a corresponding displacement.

Figure 22:
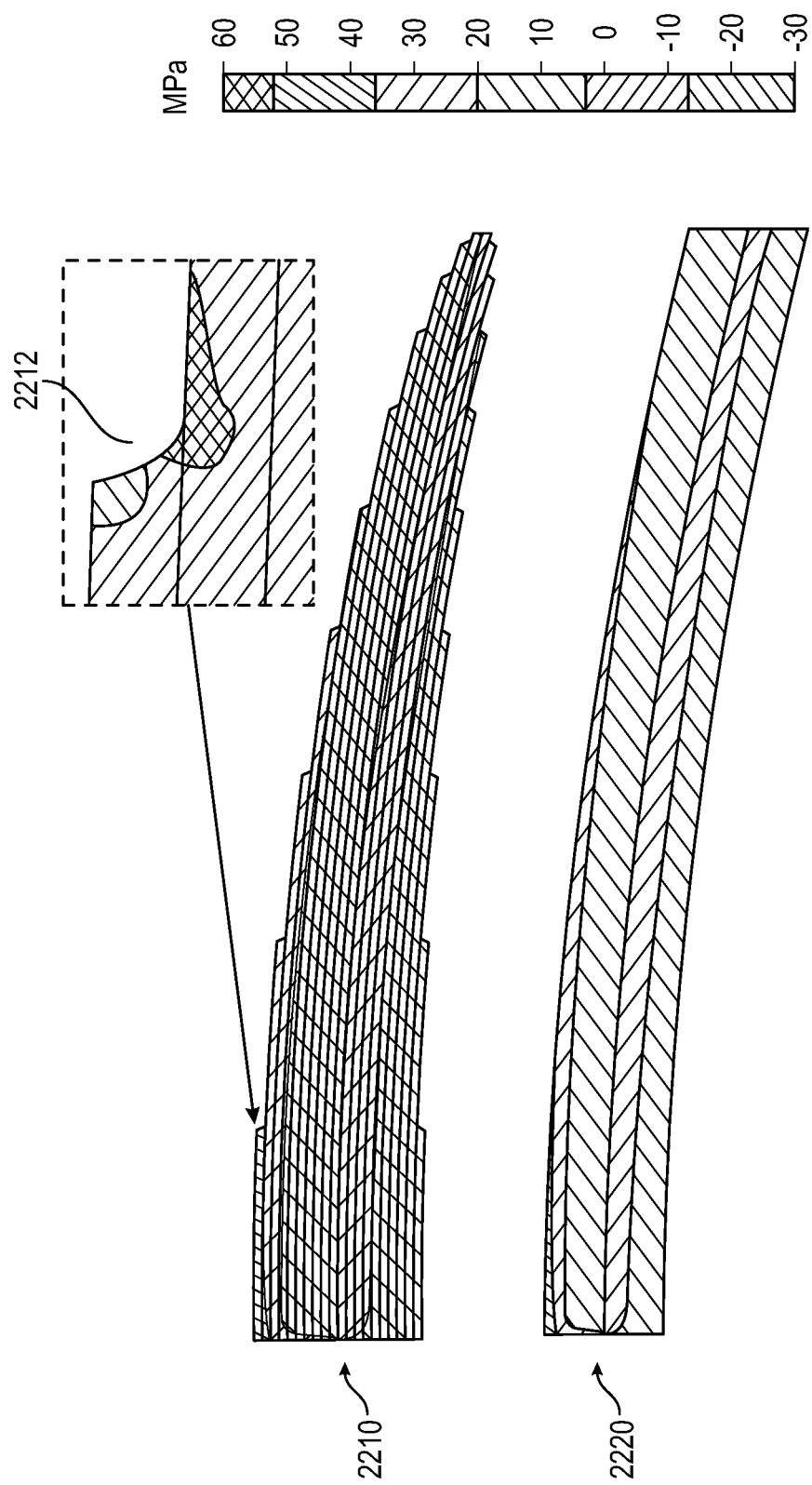
FIG. 22 is a schematic representation of the stress profile distribution during bending for (a) a stepped multimorph actuator according to various embodiments, and (b) a comparative bimorph actuator.

According to further embodiments, a comparison of the first principal stress near the step of an example piezoelectric actuator 2210 with the first principal stress of a comparative (constant thickness) actuator 2220 is shown in FIG. 22. According to some embodiments, the step edge(s) 2212 of the piezoelectric layer(s) may be filleted to decrease the stress concentration at the junction between adjacent piezoelectric layers.

Figure 23:
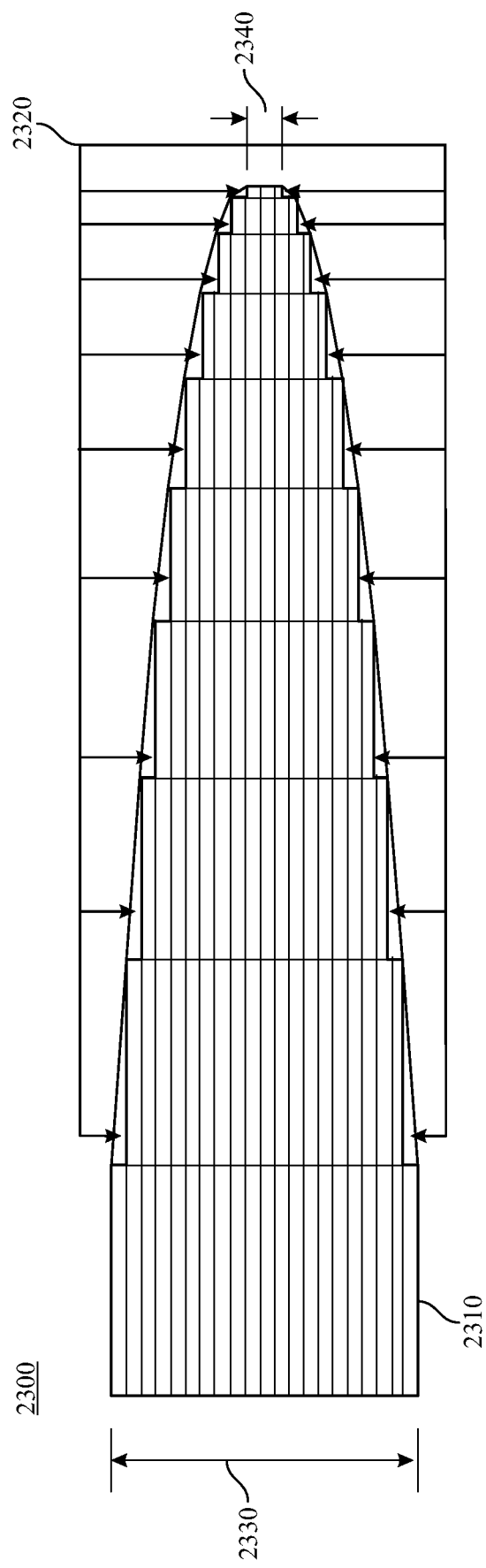
FIG. 23 is a schematic illustration showing a stepped multimorph actuator having back-filled step regions according to some embodiments.

According to further embodiments, a stepped piezoelectric actuator 2300 with the piezoelectric and electrode layers outlined by bold lines 2310 is shown in FIG. 23. In the illustrated embodiment, the actuator 2300 has a base height 2330 and a tip height 2340 and the steps between adjacent piezoelectric layers are filled with a compliant material 2320. The compliant material 2320 may be a ceramic or polymer having a high modulus, e.g., a polymer composite, such as a glass particle-filled polymer or a fiber-filled polymer. Example ceramics include the ceramic material used to form the piezoelectric layers. Example polymers include nylon, epoxies, polyimides, poly ether ether ketones, or other suitable thermoset or thermoplastic polymers. As used herein a material having a "high modulus" may, in certain examples, have a modulus of at least 10 GPa.

Figure 24:
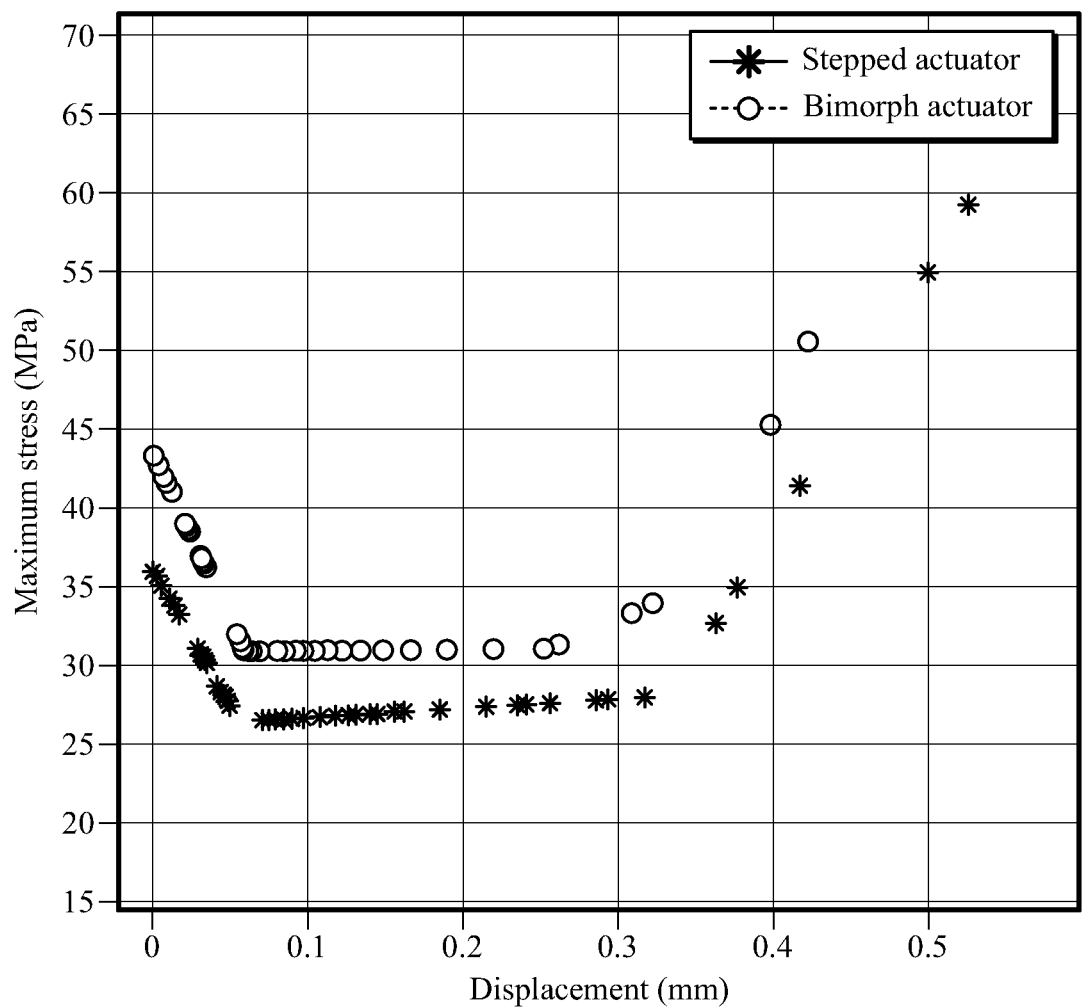
FIG. 24 is a plot of maximum stress versus displacement for the backfilled multimorph actuator of FIG. 23 according to certain embodiments.

Referring to FIG. 24, a plot of maximum stress versus displacement shows that stresses in the filled stepped piezoelectric actuator of FIG. 23 are less than those in a comparative (planar) bimorph actuator over a displacement range of approximately 0 mm to approximately 0.5 mm. According to some embodiments, in the negative spring regime, in which the actuator stresses primarily result from the tip force, the shape of the stepped actuator may substantially decrease the associated stresses.

Disclosed are stepped piezoelectric bender beam actuators. In some embodiments, the engineered deformation of a plurality of piezoelectric layers that are, for example, alternatively placed in expansion and compression by oppositely applied voltages may be used to induce bending or curvature changes in an optical element (e.g., liquid lens), which may be used to provide optical tuning such as focus or aberration control.

In certain embodiments, stepped piezoelectric actuators may be incorporated into an optical device that may include a liquid lens. However, it will be appreciated that although the current disclosure describes the formation of a stepped piezoelectric actuators and the attendant tunability of their mechanical and electromechanical properties in the context of liquid lenses, applications for such stepped actuators are not particularly limited, and the presently-disclosed materials and methods may be incorporated into additional deformable optic and other platforms.

EXAMPLE EMBODIMENTS

Example 1: A bender beam actuator includes (i) a first layer of piezoelectric material, and (ii) a second layer of piezoelectric material overlying a portion of the first layer of piezoelectric material, where a length of the first layer of piezoelectric material is at least 2% greater than a length of the second layer of piezoelectric material.

Example 2: The bender beam actuator of Example 1, where a width of the first layer of piezoelectric material is substantially equal to a width of the second layer of piezoelectric material.

Example 3: The bender beam actuator of any of Examples 1 and 2, where the first layer of piezoelectric material and the second layer of piezoelectric material form a step along the length direction, and a layer of high modulus material is disposed within the step.

Example 4: The bender beam actuator of Example 3, where the high modulus material includes a glass particle-filled polymer or a fiber-filled polymer.

Example 5: The bender beam actuator of any of Examples 1-4, where at least one of the first layer of piezoelectric material and the second layer of piezoelectric material includes a poled piezoelectric material.

Example 6: The bender beam actuator of any of Examples 1-5, where the first layer of piezoelectric material and the second layer of piezoelectric material overlap at a base end of the actuator and a thickness of the actuator at the base end is at least 10% greater than a thickness at a distal end opposite the base end.

Example 7: The bender beam actuator of any of Examples 1-6, wherein a total tip displacement of the actuator is greater than or equal to a thickness of the actuator at the base end.

Example 8: The bender beam actuator of any of Examples 1-7, further including an electrode disposed between the first layer of piezoelectric material and the second layer of piezoelectric material.

Example 9: The bender beam actuator of any of Examples 1-8, where the first layer of piezoelectric material and the second layer of piezoelectric material each have a thickness of approximately 10 nm to approximately 100 μm.

Example 10: The bender beam actuator of any of Examples 1-9, where a thickness of the first layer of piezoelectric material is substantially equal to a thickness of the second layer of piezoelectric material.

Example 11: The bender beam actuator of any of Examples 1-10, where each of the first layer of piezoelectric material and the second layer of piezoelectric material includes a ceramic composition selected from lead zirconate titanate (PZT), bismuth ferrite, barium titanate, bismuth titanate, potassium sodium niobate (KNN), barium titanate, and lead magnesium niobate-lead titanate.

Example 12: A bender beam actuator includes a primary electrode, a secondary electrode overlapping at least a portion of the primary electrode, a first layer of piezoelectric material disposed between and abutting the primary electrode and the secondary electrode, and a second layer of piezoelectric material disposed over the secondary electrode opposite to the first layer of piezoelectric material, where a length of the first layer of piezoelectric material is at least 2% greater than a length of the second layer of piezoelectric material.

Example 13: The bender beam actuator of Example 12, where a width of the first layer of piezoelectric material is substantially equal to a width of the second layer of piezoelectric material.

Example 14: The bender beam actuator of any of Examples 12 and 13, further including a tertiary electrode overlapping at least a portion of the secondary electrode.

Example 15: The bender beam actuator of Example 14, further including a third layer of piezoelectric material disposed over the tertiary electrode opposite to the second layer of piezoelectric material, where a length of the second layer of piezoelectric material is at least 2% greater than a length of the tertiary layer of piezoelectric material.

Example 16: A method includes forming a first layer of piezoelectric material and forming a second layer of piezoelectric material over the first layer of piezoelectric material to form a composite structure, where a length of the first layer of piezoelectric material is at least 2% greater than a length of the second layer of piezoelectric material.

Example 17: The method of Example 16, further including forming an electrode over the first layer of piezoelectric material prior to forming the second layer of piezoelectric material.

Example 18: The method of Example 17, where the electrode is formed directly over the first layer of piezoelectric material and the second layer of piezoelectric material is formed directly over the electrode.

Example 19: The method of any of Examples 16-18, further including heating and applying pressure to the composite structure within a mold.

Example 20: The method of Example 19, where the mold includes a lower portion and a mating upper portion and at least one of the lower portion and the upper portion includes a plurality of independently moveable components.

Although bimorph and multimorph actuators are described herein as having a layer of piezoelectric material disposed between conductive electrodes, as will be appreciated by those skilled in the art, other active materials may be used, including electroactive and electrostrictive compositions.

According to various embodiments, the actuators disclosed herein may be operated with open or closed-loop control. Open-loop controllers typically operate without feedback and may include the execution of one or more control efforts directed at achieving a desired result. In a closed-loop control system, information may flow around a feedback loop that may, by way of example, include an artificial reality device, a sensor, a transmitter, a controller, and an actuator connected to the artificial reality device. When operated in the foregoing sequence, the measure-decide-actuate paradigm may be repeated until a desired process condition is achieved.

A closed-loop control system may include one or more sensors, such as a capacitive, mechanical, electromechanical, or optical sensor. In some embodiments, a layer of piezoelectric material may operate as a sensor. In some embodiments, an example electromechanical sensor may include a linear variable displacement transformer (LVDT). In some embodiments, an optical sensor may operate in conjunction with a light source that is configured to illuminate a target area near the distal end of the actuator, for example.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 2500 in FIG. 25. Other artificial reality systems may include a NED that also provides visibility into the real world (e.g., augmented-reality system 2600 in FIG. 26) or that visually immerses a user in an artificial reality (e.g., virtual-reality system 2700 in FIG. 27). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 25:
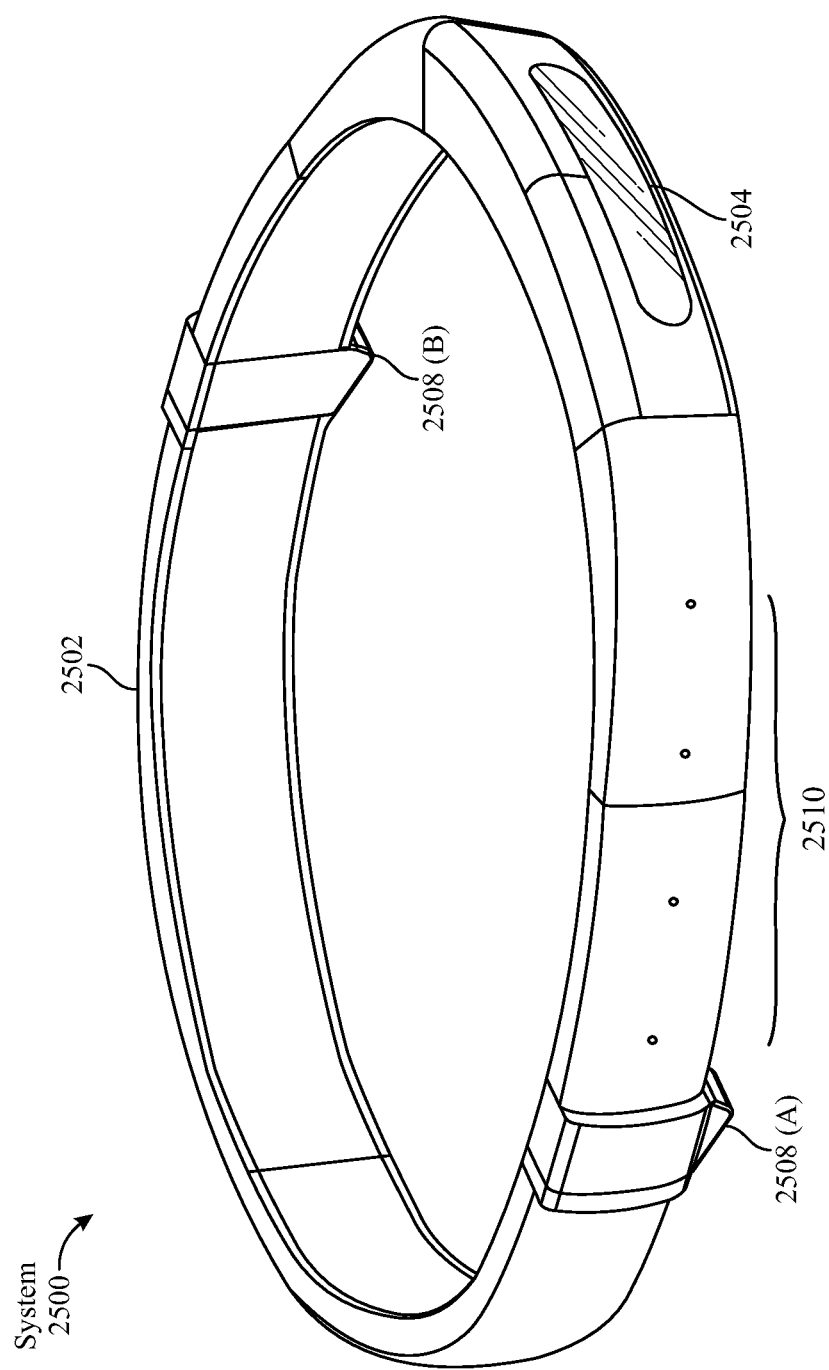
FIG. 25 is an illustration of an exemplary artificial-reality headband that may be used in connection with embodiments of this disclosure.

Turning to FIG. 25, augmented-reality system 2500 generally represents a wearable device dimensioned to fit about a body part (e.g., a head) of a user. As shown in FIG. 25, system 2500 may include a frame 2502 and a camera assembly 2504 that is coupled to frame 2502 and configured to gather information about a local environment by observing the local environment. Augmented-reality system 2500 may also include one or more audio devices, such as output audio transducers 2508(A) and 2508(B) and input audio transducers 2510. Output audio transducers 2508(A) and 2508(B) may provide audio feedback and/or content to a user, and input audio transducers 2510 may capture audio in a user's environment As shown, augmented-reality system 2500 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 2500 may not include a NED, augmented-reality system 2500 may include other types of screens or visual feedback devices (e.g., a display screen integrated into a side of frame 2502).

Figure 26:
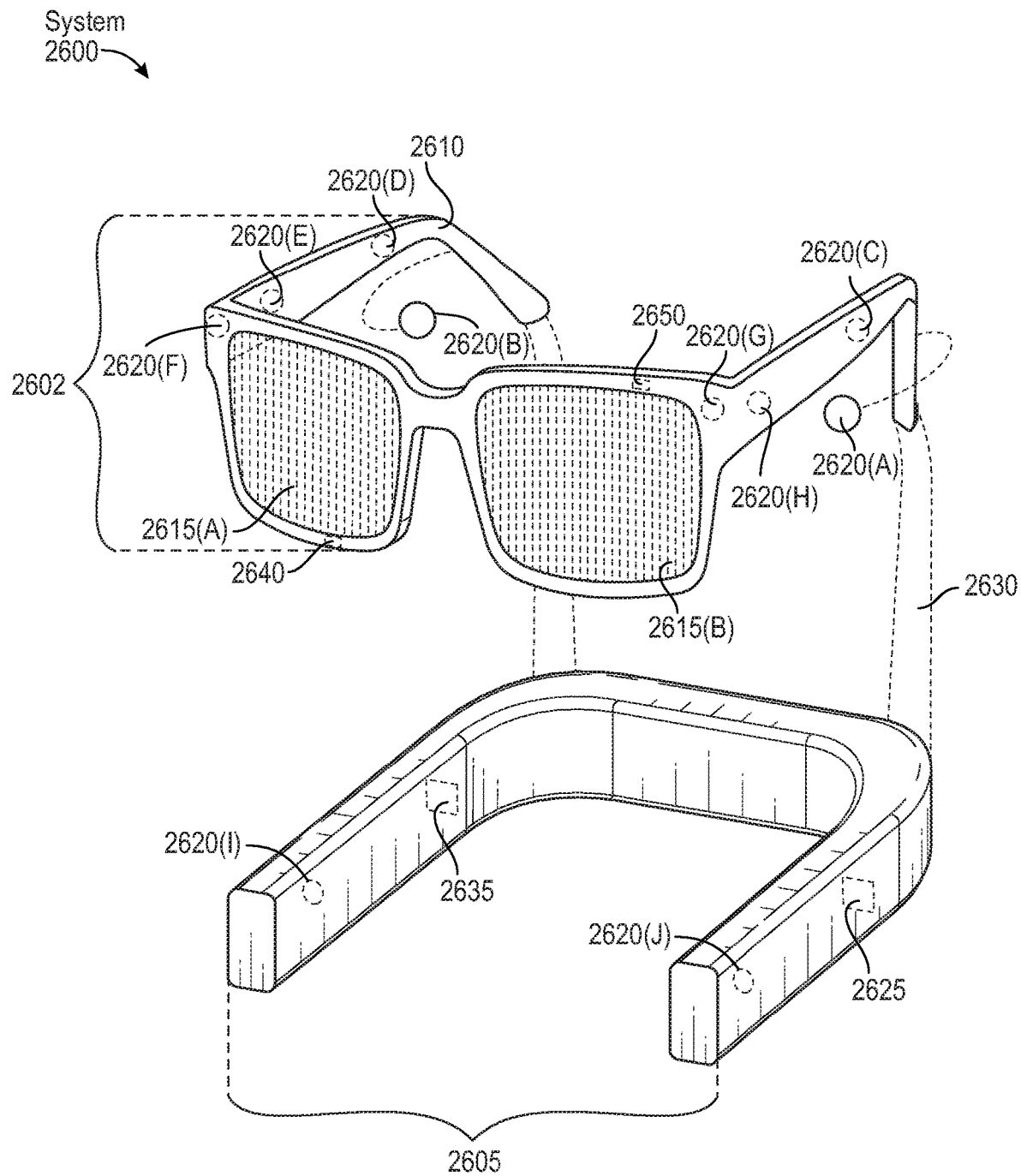
FIG. 26 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 26, augmented-reality system 2600 may include an eyewear device 2602 with a frame 2610 configured to hold a left display device 2615(A) and a right display device 2615(B) in front of a user's eyes. Display devices 2615(A) and 2615(B) may act together or independently to present an image or series of images to a user. While augmented-reality system 2600 includes two displays, embodiments of this disclosure may be implemented in augmented-reality systems with a single NED or more than two NEDs.

In some embodiments, augmented-reality system 2600 may include one or more sensors, such as sensor 2640. Sensor 2640 may generate measurement signals in response to motion of augmented-reality system 2600 and may be located on substantially any portion of frame 2610. Sensor 2640 may represent a position sensor, an inertial measurement unit (IMU), a depth camera assembly, or any combination thereof. In some embodiments, augmented-reality system 2600 may or may not include sensor 2640 or may include more than one sensor. In embodiments in which sensor 2640 includes an IMU, the IMU may generate calibration data based on measurement signals from sensor 2640. Examples of sensor 2640 may include, without limitation, accelerometers, gyroscopes, magnetometers, other suitable types of sensors that detect motion, sensors used for error correction of the IMU, or some combination thereof.

Augmented-reality system 2600 may also include a microphone array with a plurality of acoustic transducers 2620(A)-2620(J), referred to collectively as acoustic transducers 2620. Acoustic transducers 2620 may be transducers that detect air pressure variations induced by sound waves. Each acoustic transducer 2620 may be configured to detect sound and convert the detected sound into an electronic format (e.g., an analog or digital format). The microphone array in FIG. 26 may include, for example, ten acoustic transducers: 2620(A) and 2620(B), which may be designed to be placed inside a corresponding ear of the user, acoustic transducers 2620(C), 2620(D), 2620(E), 2620(F), 2620(G), and 2620(H), which may be positioned at various locations on frame 2610, and/or acoustic transducers 2620(1) and 2620(J), which may be positioned on a corresponding neckband 2605.

In some embodiments, one or more of acoustic transducers 2620(A)-(J) may be used as output transducers (e.g., speakers). For example, acoustic transducers 2620(A) and/or 2620(B) may be earbuds or any other suitable type of headphone or speaker.

The configuration of acoustic transducers 2620 of the microphone array may vary. While augmented-reality system 2600 is shown in FIG. 26 as having ten acoustic transducers 2620, the number of acoustic transducers 2620 may be greater or less than ten. In some embodiments, using higher numbers of acoustic transducers 2620 may increase the amount of audio information collected and/or the sensitivity and accuracy of the audio information. In contrast, using a lower number of acoustic transducers 2620 may decrease the computing power required by the controller 2650 to process the collected audio information. In addition, the position of each acoustic transducer 2620 of the microphone array may vary. For example, the position of an acoustic transducer 2620 may include a defined position on the user, a defined coordinate on frame 2610, an orientation associated with each acoustic transducer, or some combination thereof.

Acoustic transducers 2620(A) and 2620(B) may be positioned on different parts of the user's ear, such as behind the pinna or within the auricle or fossa. Or, there may be additional acoustic transducers on or surrounding the ear in addition to acoustic transducers 2620 inside the ear canal. Having an acoustic transducer positioned next to an ear canal of a user may enable the microphone array to collect information on how sounds arrive at the ear canal. By positioning at least two of acoustic transducers 2620 on either side of a user's head (e.g., as binaural microphones), augmented-reality device 2600 may simulate binaural hearing and capture a 3D stereo sound field around about a user's head. In some embodiments, acoustic transducers 2620(A) and 2620(B) may be connected to augmented-reality system 2600 via a wired connection 2630, and in other embodiments, acoustic transducers 2620(A) and 2620(B) may be connected to augmented-reality system 2600 via a wireless connection (e.g., a Bluetooth connection). In still other embodiments, acoustic transducers 2620(A) and 2620(B) may not be used at all in conjunction with augmented-reality system 2600.

Acoustic transducers 2620 on frame 2610 may be positioned along the length of the temples, across the bridge, above or below display devices 2615(A) and 2615(B), or some combination thereof. Acoustic transducers 2620 may be oriented such that the microphone array is able to detect sounds in a wide range of directions surrounding the user wearing the augmented-reality system 2600. In some embodiments, an optimization process may be performed during manufacturing of augmented-reality system 2600 to determine relative positioning of each acoustic transducer 2620 in the microphone array.

In some examples, augmented-reality system 2600 may include or be connected to an external device (e.g., a paired device), such as neckband 2605. Neckband 2605 generally represents any type or form of paired device. Thus, the following discussion of neckband 2605 may also apply to various other paired devices, such as charging cases, smart watches, smart phones, wrist bands, other wearable devices, hand-held controllers, tablet computers, laptop computers and other external compute devices, etc.

As shown, neckband 2605 may be coupled to eyewear device 2602 via one or more connectors. The connectors may be wired or wireless and may include electrical and/or non-electrical (e.g., structural) components. In some cases, eyewear device 2602 and neckband 2605 may operate independently without any wired or wireless connection between them. While FIG. 26 illustrates the components of eyewear device 2602 and neckband 2605 in example locations on eyewear device 2602 and neckband 2605, the components may be located elsewhere and/or distributed differently on eyewear device 2602 and/or neckband 2605. In some embodiments, the components of eyewear device 2602 and neckband 2605 may be located on one or more additional peripheral devices paired with eyewear device 2602, neckband 2605, or some combination thereof.

Pairing external devices, such as neckband 2605, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2600 may be provided by a paired device or shared between a paired device and an eyewear device, thus reducing the weight, heat profile, and form factor of the eyewear device overall while still retaining desired functionality. For example, neckband 2605 may allow components that would otherwise be included on an eyewear device to be included in neckband 2605 since users may tolerate a heavier weight load on their shoulders than they would tolerate on their heads. Neckband 2605 may also have a larger surface area over which to diffuse and disperse heat to the ambient environment. Thus, neckband 2605 may allow for greater battery and computation capacity than might otherwise have been possible on a stand-alone eyewear device. Since weight carried in neckband 2605 may be less invasive to a user than weight carried in eyewear device 2602, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 2605 may be communicatively coupled with eyewear device 2602 and/or to other devices. These other devices may provide certain functions (e.g., tracking, localizing, depth mapping, processing, storage, etc.) to augmented-reality system 2600. In the embodiment of FIG. 26, neckband 2605 may include two acoustic transducers (e.g., 2620(1) and 2620(J)) that are part of the microphone array (or potentially form their own microphone subarray). Neckband 2605 may also include a controller 2625 and a power source 2635.

Acoustic transducers 2620(1) and 2620(J) of neckband 2605 may be configured to detect sound and convert the detected sound into an electronic format (analog or digital). In the embodiment of FIG. 26, acoustic transducers 2620(1) and 2620(J) may be positioned on neckband 2605, thereby increasing the distance between the neckband acoustic transducers 2620(1) and 2620(J) and other acoustic transducers 2620 positioned on eyewear device 2602. In some cases, increasing the distance between acoustic transducers 2620 of the microphone array may improve the accuracy of beamforming performed via the microphone array. For example, if a sound is detected by acoustic transducers 2620(C) and 2620(D) and the distance between acoustic transducers 2620(C) and 2620(D) is greater than, e.g., the distance between acoustic transducers 2620(D) and 2620(E), the determined source location of the detected sound may be more accurate than if the sound had been detected by acoustic transducers 2620(D) and 2620(E).

Controller 2625 of neckband 2605 may process information generated by the sensors on neckband 2605 and/or augmented-reality system 2600. For example, controller 2625 may process information from the microphone array that describes sounds detected by the microphone array. For each detected sound, controller 2625 may perform a direction-of-arrival (DOA) estimation to estimate a direction from which the detected sound arrived at the microphone array. As the microphone array detects sounds, controller 2625 may populate an audio data set with the information. In embodiments in which augmented-reality system 2600 includes an inertial measurement unit, controller 2625 may compute all inertial and spatial calculations from the IMU located on eyewear device 2602. A connector may convey information between augmented-reality system 2600 and neckband 2605 and between augmented-reality system 2600 and controller 2625. The information may be in the form of optical data, electrical data, wireless data, or any other transmittable data form. Moving the processing of information generated by augmented-reality system 2600 to neckband 2605 may reduce weight and heat in eyewear device 2602, making it more comfortable to the user.

Power source 2635 in neckband 2605 may provide power to eyewear device 2602 and/or to neckband 2605. Power source 2635 may include, without limitation, lithium ion batteries, lithium-polymer batteries, primary lithium batteries, alkaline batteries, or any other form of power storage. In some cases, power source 2635 may be a wired power source. Including power source 2635 on neckband 2605 instead of on eyewear device 2602 may help better distribute the weight and heat generated by power source 2635.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 2700 in FIG. 27, that mostly or completely covers a user's field of view. Virtual-reality system 2700 may include a front rigid body 2702 and a band 2704 shaped to fit around a user's head. Virtual-reality system 2700 may also include output audio transducers 2706(A) and 2706(B). Furthermore, while not shown in FIG. 27, front rigid body 2702 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 2700 and/or virtual-reality system 2700 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 2600 and/or virtual-reality system 2700 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 2500, augmented-reality system 2600, and/or virtual-reality system 2700 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more off these sensors to identify a location of a user, to map the real world, to provide a user with context about real-world surroundings, and/or to perform a variety of other functions.

Artificial reality systems may also include one or more input and/or output audio transducers. In the examples shown in FIGS. 25 and 27, output audio transducers 2508(A), 2508(B), 2706(A), and 2706(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 2510 may include condenser microphones, dynamic microphones, ribbon microphones, and/or any other type or form of input transducer. In some embodiments, a single transducer may be used for both audio input and audio output.

Figure 27:
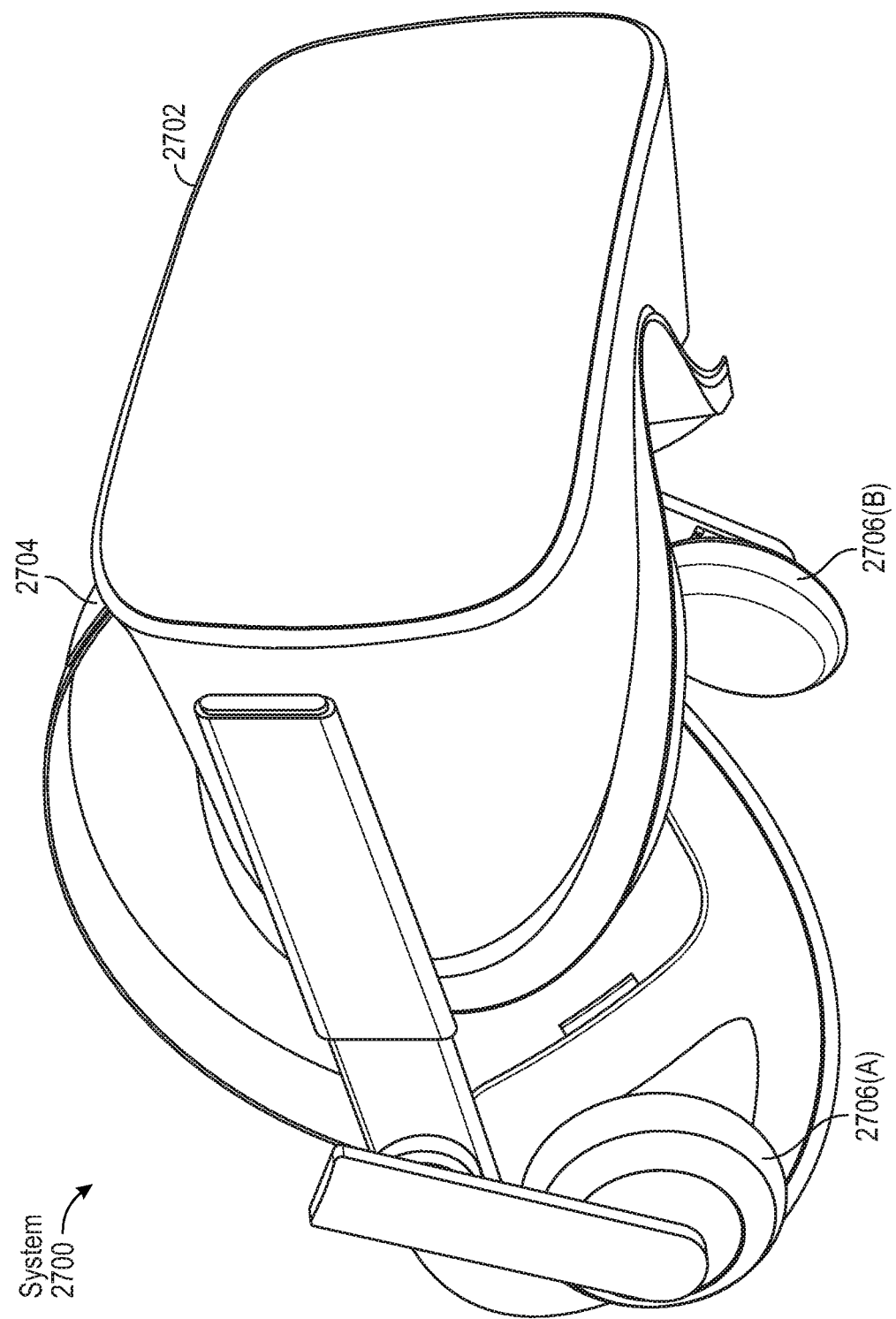
FIG. 27 is an illustration of an exemplary virtual-reality headset that may be used in connection with embodiments of this disclosure.

While not shown in FIGS. 25-27, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A bender beam actuator comprising:
    a first multimorph comprising:
        a first layer of piezoelectric material; and
        a second layer of piezoelectric material overlying a portion of the first layer of piezoelectric material, wherein a length of the first layer of piezoelectric material is at least 2% greater than a length of the second layer of piezoelectric material; and
    a second multimorph comprising:
        a third layer of piezoelectric material; and
        a fourth layer of piezoelectric material overlying a portion of the third layer of piezoelectric material,
    wherein a length of the third layer of piezoelectric material is equal to the length of the first layer of piezoelectric material, the length of the fourth layer of piezoelectric material is equal to the length of the second layer of piezoelectric material, the third layer of piezoelectric material overlies the first layer of piezoelectric material on a side opposite the second layer of piezoelectric material, and the third layer of piezoelectric material is in direct contact with the first layer of piezoelectric material.

2. The bender beam actuator of claim 1, wherein a width of the first layer of piezoelectric material is substantially equal to a width of the second layer of piezoelectric material.

3. The bender beam actuator of claim 1, wherein at least one of the first layer of piezoelectric material and the second layer of piezoelectric material comprises a poled piezoelectric material.

4. The bender beam actuator of claim 1, further comprising an electrode disposed between the first layer of piezoelectric material and the second layer of piezoelectric material.

5. The bender beam actuator of claim 1, wherein the first layer of piezoelectric material and the second layer of piezoelectric material each have a thickness of approximately 10 nm to approximately 100 μm.

6. The bender beam actuator of claim 1, wherein a thickness of the first layer of piezoelectric material is substantially equal to a thickness of the second layer of piezoelectric material.

7. The bender beam actuator of claim 1, wherein each of the first layer of piezoelectric material and the second layer of piezoelectric material comprises a ceramic composition selected from the group consisting of lead zirconate titanate (PZT), bismuth ferrite, barium titanate, bismuth titanate, potassium sodium niobate (KNN), barium titanate, and lead magnesium niobate-lead titanate.

8. The bender beam actuator of claim 1, wherein the first layer of piezoelectric material and the second layer of piezoelectric material form a step along a length direction, and a layer of high modulus material is disposed within the step.

9. The bender beam actuator of claim 8, wherein the high modulus material comprises a ceramic particle-filled polymer, a glass particle-filled polymer, or a fiber-filled polymer.

10. The bender beam actuator of claim 1, wherein the first layer of piezoelectric material and the second layer of piezoelectric material overlap at a base end of the actuator, and a thickness of the actuator at the base end is at least 10% greater than a thickness at a distal end opposite the base end.

11. The bender beam actuator of claim 10, having a total tip displacement greater than or equal to the thickness at the base end.

12. A bender beam actuator comprising:
    a first multimorph comprising:
        a primary electrode;
        a secondary electrode overlapping at least a portion of the primary electrode;
        a first layer of piezoelectric material disposed between and abutting the primary electrode and the secondary electrode; and
        a second layer of piezoelectric material disposed over the secondary electrode opposite to the first layer of piezoelectric material, wherein a length of the first layer of piezoelectric material is at least 2% greater than a length of the second layer of piezoelectric material; and
    a second multimorph comprising:
        another primary electrode;
        another secondary electrode overlapping at least a portion of the other primary electrode;
        a third layer of piezoelectric material disposed between and abutting the other primary electrode and the other secondary electrode; and
        a fourth layer of piezoelectric material disposed over the other secondary electrode opposite to the third layer of piezoelectric material,
    wherein a length of the third layer of piezoelectric material is equal to the length of the first layer of piezoelectric material, the length of the fourth layer of piezoelectric material is equal to the length of the second layer of piezoelectric material, the third layer of piezoelectric material overlies the first layer of piezoelectric material on a side opposite the second layer of piezoelectric material, and the third layer of piezoelectric material is in direct contact with the first layer of piezoelectric material.

13. The bender beam actuator of claim 12, wherein a width of the first layer of piezoelectric material is substantially equal to a width of the second layer of piezoelectric material.

14. The bender beam actuator of claim 12, further comprising a tertiary electrode overlapping at least a portion of the secondary electrode.

15. The bender beam actuator of claim 14, further comprising a fifth layer of piezoelectric material disposed over the tertiary electrode opposite to the second layer of piezoelectric material, wherein a length of the second layer of piezoelectric material is at least 2% greater than a length of the fifth layer of piezoelectric material.

16. A method comprising:
forming a first multimorph at least in part by:
  forming a first layer of piezoelectric material; and
  forming a second layer of piezoelectric material over the first layer of piezoelectric material to form a composite structure, wherein a length of the first layer of piezoelectric material is at least 2% greater than a length of the second layer of piezoelectric material; and
forming a second multimorph at least in part by:
  forming a third layer of piezoelectric material; and
  forming a fourth layer of piezoelectric material over the third layer of piezoelectric material to form a composite structure,
wherein a length of the third layer of piezoelectric material is equal to the length of the first layer of piezoelectric material, the length of the fourth layer of piezoelectric material is equal to the length of the second layer of piezoelectric material, the third layer of piezoelectric material overlies the first layer of piezoelectric material on a side opposite the second layer of piezoelectric material, and the third layer of piezoelectric material is in direct contact with the first layer of piezoelectric material.

17. The method of claim 16, further comprising forming an electrode over the first layer of piezoelectric material prior to forming the second layer of piezoelectric material.

18. The method of claim 17, wherein the electrode is formed directly over the first layer of piezoelectric material and the second layer of piezoelectric material is formed directly over the electrode.

19. The method of claim 16, further comprising heating and applying pressure to the composite structure within a mold.

20. The method of claim 19, wherein the mold comprises a lower portion and a mating upper portion and at least one of the lower portion and the upper portion comprises a plurality of independently moveable components.

* * * * *